(12) United States Patent
Lee et al.

(10) Patent No.: US 8,289,491 B2
(45) Date of Patent: Oct. 16, 2012

(54) LIQUID CRYSTAL DISPLAY DEVICE WITH SHIELD LINES ON DATA LINES AND THIN FILM TRANSISTOR COMPONENTS

(75) Inventors: Sook-Woo Lee, Annyang-si (KR); Yung In Park, Annyang-si (KR)

(73) Assignee: LG Display Co., Ltd., Seoul (KR)

( * ) Notice: Subject to any disclaimer, the term of this patent is extended or adjusted under 35 U.S.C. 154(b) by 913 days.

(21) Appl. No.: 11/449,378

(22) Filed: Jun. 8, 2006

(65) Prior Publication Data

US 2007/0103608 A1    May 10, 2007

(30) Foreign Application Priority Data

Nov. 9, 2005    (KR) .......................... 10-2005-0106839

(51) Int. Cl.
*G02F 1/136*    (2006.01)
*G02F 1/1343*    (2006.01)
*G02F 1/1345*    (2006.01)

(52) U.S. Cl. ............................ 349/147; 349/43; 349/151

(58) Field of Classification Search ................... 349/38, 349/47, 147–148, 43, 151
See application file for complete search history.

(56) References Cited

U.S. PATENT DOCUMENTS

| | | | | |
|---|---|---|---|---|
| 2002/0012078 | A1* | 1/2002 | Jung et al. ........................ | 349/38 |
| 2002/0154252 | A1* | 10/2002 | Toyota et al. ................... | 349/38 |
| 2003/0086046 | A1* | 5/2003 | You ............................... | 349/149 |
| 2004/0129943 | A1* | 7/2004 | Yoo et al. ........................ | 257/72 |
| 2004/0165121 | A1* | 8/2004 | Tsujimura et al. .............. | 349/42 |

FOREIGN PATENT DOCUMENTS

| | | | |
|---|---|---|---|
| CN | 1680992 A | | 10/2005 |
| JP | 06-118449 | | 4/1994 |
| JP | 06118449 A | * | 4/1994 |
| JP | 2001-188240 | | 7/2001 |
| JP | 2003-098515 | | 4/2003 |
| JP | 2003-273124 | | 9/2003 |

OTHER PUBLICATIONS

Office Action issued in corresponding Chinese Patent Application No. 200610087272.5; issued Apr. 4, 2008.
Office Action issued in corresponding Chinese Patent Application No. 200910159473.5; issued Aug. 4, 2010.
Office Action issued in corresponding Japanese Patent Application No. 2006-180059; issued Feb. 16, 2010.

* cited by examiner

*Primary Examiner* — Jessica M Merlin
(74) *Attorney, Agent, or Firm* — Brinks Hofer Gilson & Lione

(57) ABSTRACT

A liquid crystal display device includes a p-type driving thin film transistor and an n-type driving thin film transistor in a non-display region of a substrate. The p-type driving thin film transistor includes a first polycrystalline semiconductor pattern, a first gate electrode, a first source electrode and a first drain electrode. The n-type driving thin film transistor includes a second polycrystalline semiconductor pattern, a second gate electrode, a second source electrode and a second drain electrode. The liquid crystal display device further includes a gate line and a data line in a display region of the substrate and that cross each other to define a pixel region, and a pixel thin film transistor connected to the gate line and the data line. The pixel thin film transistor also includes a third polycrystalline semiconductor pattern, a third gate electrode, a third source electrode and a third drain electrode. The liquid crystal display device further comprises a pixel electrode that covers and directly contacts the third drain electrode, a shield pattern that covers and directly contacts each of the first source electrode and the first drain electrode and the second source electrode and the second drain electrode, and a shield line that covers and directly contacts the data lines and the third source electrode.

9 Claims, 48 Drawing Sheets n+ ion doping p+ ion doping

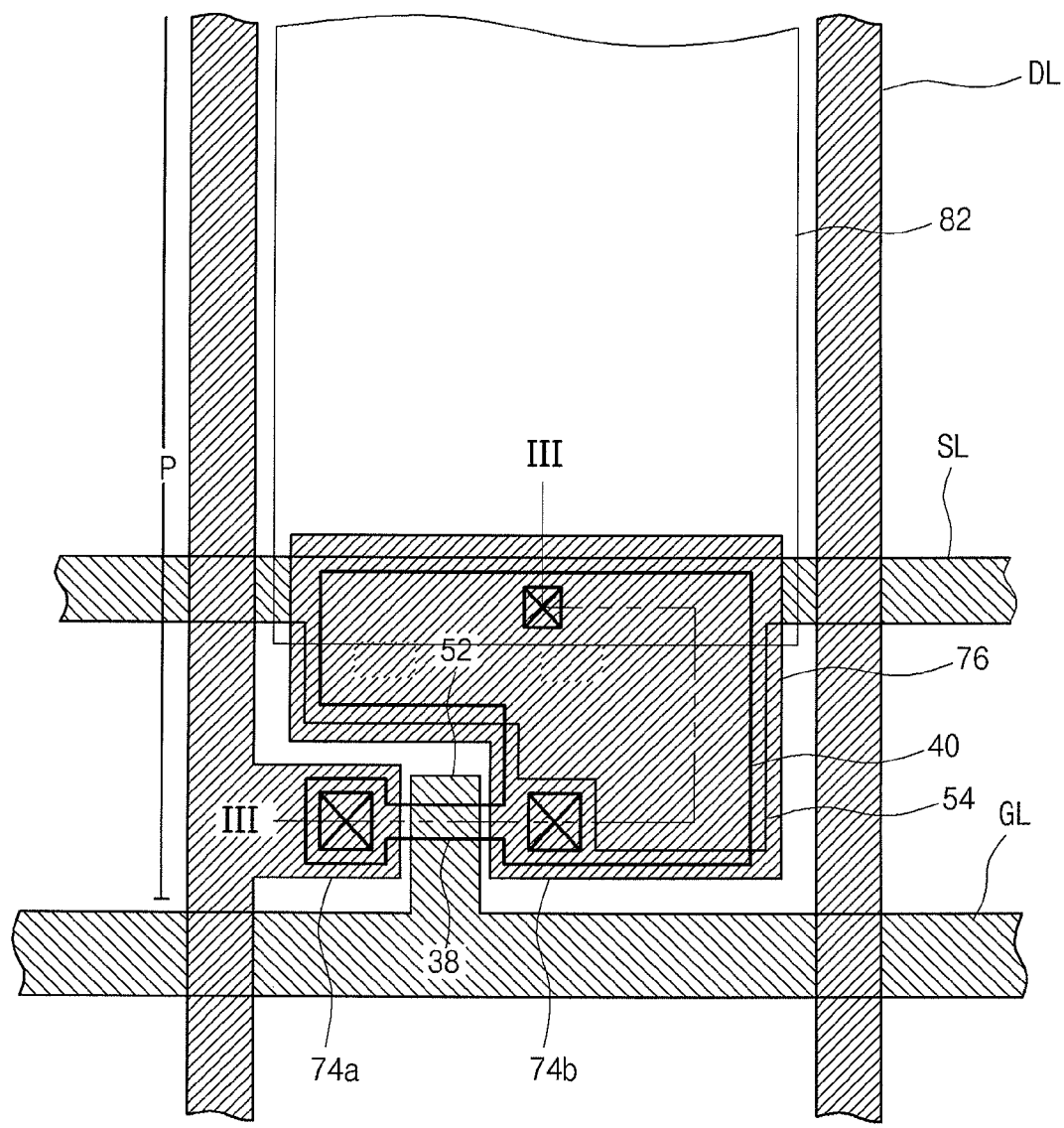

n+ ion doping p+ ion doping p+ ion doping

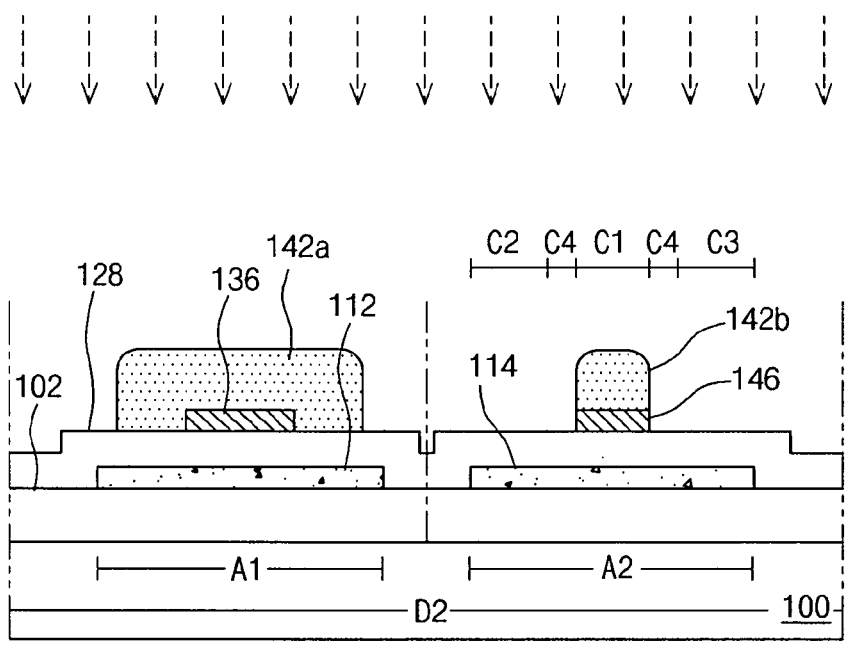
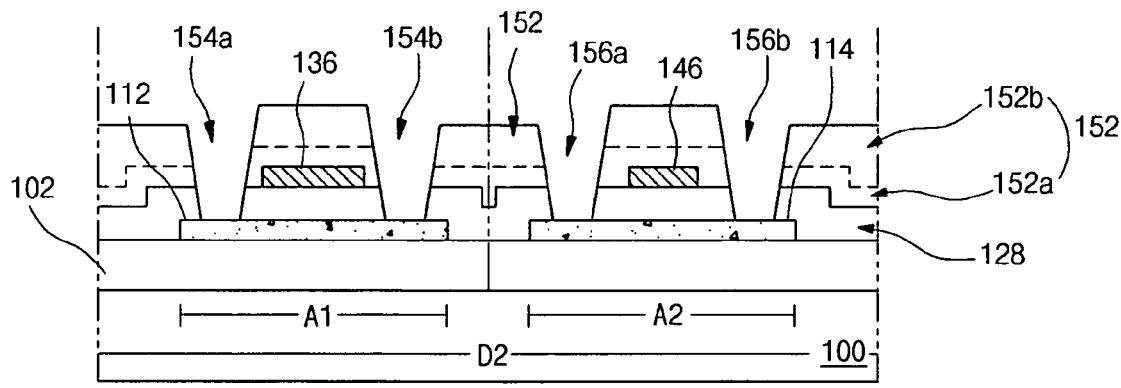

(118, 124, 110c)

p+ ion doping

LIQUID CRYSTAL DISPLAY DEVICE WITH SHIELD LINES ON DATA LINES AND THIN FILM TRANSISTOR COMPONENTS

The present invention claims the benefit of Korean Patent Application No. 10-2005-0106839, filed in Korea on Nov. 9, 2005, which is hereby incorporated by reference.

FIELD

The present invention relates to a liquid crystal display device, and more particularly, to a liquid crystal display device and a method of fabricating the same.

BACKGROUND

Until recently, display devices have typically used cathode-ray tubes (CRTs). Presently, much effort is being expended to study and develop various types of flat panel displays, such as liquid crystal display (LCD) devices, plasma display panels (PDPs), field emission displays (FED), and electro-luminescence displays (ELDs), as a substitute for CRTs. In particular, these types of flat panel displays have been driven in an active matrix type display in which a plurality of pixels arranged in a matrix form are driven using a plurality of thin film transistors therein. Among the active matrix types of flat panel displays, liquid crystal display (LCD) devices and electroluminescent display (ELD) devices are widely used as monitors for notebook computers and desktop computers because of their high resolution, ability to display colors and superiority in displaying moving images.

In general, an LCD device includes array and color filter substrates that are spaced part and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field in the direction of the induced electric field, thereby changing the light transmissivity of the LCD device. Thus, the LCD device displays images by varying the intensity of the induced electric field.

Recently, an active matrix type LCD device is used, where thin film transistors are arranged in a matrix manner on an array substrate. Amorphous silicon or polycrystalline silicon is used as a semiconductor layer of the thin film transistor. When hydrogenated amorphous silicon (a-Si:H) is used, low temperature process is possible, and thus a low-priced substrate can be used. However, since hydrogenated amorphous silicon has a poor electric property such as low mobility of 0.1 to 1.0 cm$^2$/Vs, it is difficult to use hydrogenated amorphous silicon to form driving circuits directly on an array substrate. Polycrystalline silicon has mobility higher than that of hydrogenated amorphous silicon. Accordingly, when using polycrystalline silicon, driving circuits are easily formed directly on an array substrate, and a liquid crystal panel has a compact size.

FIG. 1 is a schematic plan view of an array substrate for an LCD device according to the related art.

As shown in FIG. 1, a display region D1 and a non-display region D2 are defined in a substrate 10. In the display region D1, a plurality of gate lines 12 and a plurality of data lines 14 are disposed on the substrate 10 and cross each other to define a plurality of pixel regions P. In each pixel region P, a pixel thin film transistor T and a pixel electrode 17 are disposed. The pixel thin film transistor T is an n-type or p-type.

In the non-display region D2, gate and data driving circuits 16 and 18 are disposed on the substrate 10. The gate driving circuit 16 is disposed at one side of the substrate 10 and supplies gate signals to the gate lines 12, and the data driving circuit 18 is disposed at other side of the substrate 10 and supplies data signals to the data lines 14. The gate and data driving circuits 16 and 18 include CMOS (complementary metal-oxide semiconductor) device having an n-type driving thin film transistor and a p-type driving thin film transistor.

FIG. 2 is a plan view of a display region of an array substrate for an LCD device of FIG. 1.

As shown in FIG. 2, on a substrate 30, a gate line GL is extended along a first direction, and a data line DL is extended along a second direction. The gate line GL and the data line DL cross each other to define a pixel region P. A storage line SL is extended along the first direction and spaced apart from the gate line GL.

A pixel thin film transistor T is disposed at a crossing portion of the gate and data lines GL and DL. The pixel thin film transistor T includes a gate electrode 52, a polycrystalline semiconductor pattern 38, a source electrode 74a and a drain electrode 74b. A pixel electrode 82 is disposed in the pixel region P and contacts the drain electrode 74b. A storage capacitor Cst including first, second and third storage electrodes 40, 54 and 76 is disposed in the pixel region P.

FIG. 3A is a cross-sectional view of a portion of a driving circuit for an LCD device of FIG. 1, and FIG. 3B is a cross-sectional view taken along a line III-III of FIG. 2.

As shown in FIGS. 3A and 3B, a driving circuit (a gate or data driving circuit) DC in a non-display region D2 includes a CMOS device, and the CMOS device includes a p-type driving thin film transistor T(p) and an n-type driving thin film transistor T(n).

In a pixel region P of a display region D1, a pixel electrode 82 contacting a pixel thin film transistor Ts and a pixel storage capacitor Cst are disposed. The pixel thin film transistor Ts is n-type or p-type, and an n-type thin film transistor is mainly used as the pixel thin film transistor Ts. The pixel storage capacitor Cst includes first, second and third stage electrodes 40, 54 and 76. The pixel storage capacitor Cst includes a first storage capacitor C1 and a second storage capacitor C2.

FIGS. 4A to 4I are cross-sectional views illustrating fabrication processes in a non-display region of the related art array substrate, FIGS. 5A to 5I are plan views illustrating fabrication processes in a display region of the related art array substrate, and FIGS. 6A to 6I are cross-sectional views taken along lines III-III of FIGS. 5A to 5I, respectively.

As shown in FIGS. 4A, 5A and 6A, a buffer layer 32 is formed on a substrate 30 having a display region D1 and a non-display region D2. The display region D1 has a pixel region P, a switching region A3 and a storage region A4, and the non-display region D2 has a p-type region A1 and an n-type region A2. Hydrogenated amorphous silicon (a-Si:H) is deposited on the buffer layer 32 and crystallized. The crystallized silicon (polycrystalline silicon) layer is patterned in a first mask process to form first, second, third and fourth polycrystalline semiconductor patterns 34, 36, 38 and 40 in the p-type region A1, the n-type region A2, the switching region A3 and the storage region A4, respectively. The third and fourth polycrystalline semiconductor patterns 38 and 40 are formed in one body.

As shown in FIGS. 4B, 5B and 6B, a photoresist is deposited on the substrate 30 having the polycrystalline semiconductor patterns 34, 36, 38 and 40 and patterned in a second mask process to form a photoresist pattern 42. The photoresist pattern 42 covers the p-type region A1, the n-type region A2 and the switching region A3. An ion doping process using n+ ions is performed for the fourth polycrystalline semiconductor pattern 40. By the doping process, a resistance of the fourth polycrystalline semiconductor pattern 40 is reduced. After the doping process, the photoresist pattern 42 is removed. The doped fourth polycrystalline semiconductor pattern 40 is a first storage electrode 40.

As shown in FIGS. 4C, 5C and 6C, a gate insulating layer 46 is formed on the substrate 30 having the fist storage electrode 40. A metallic material is deposited on the gate insulating layer 46 and patterned in a third mask process to form first to third gate electrodes 48, 50 and 52 and a second storage electrode 54. The first to third gate electrodes 48, 50 and 52 correspond to center portions of the first to third polycrystalline semiconductor patterns 34, 36 and 38, respectively, and the second storage electrode 54 corresponds to the first storage electrode 40. In the third mask process, a gate line GL and a storage line SL are also formed.

As shown in FIGS. 4D, 5D and 6D, a photoresist is deposited on the substrate 30 having the gate electrodes 48, 50 and 52 and patterned in a fourth mask process to form a photoresist pattern 56. The photoresist pattern 56 covers the p-type region A1. An ion doping process using n+ ions is performed for the n-type region A2 and the switching region A3. Side portions of the second and third polycrystalline semiconductor patterns 36 and 38 are doped with n+ ions. The ion-doped side portions of the second and third polycrystalline semiconductor patterns 36 and 38 have an ohmic contact property. The photoresist pattern 56 is then removed.

As shown in FIGS. 4E, 5E and 6E, a photoresist is deposited on the substrate 30, where the n+ doping process is completed, and patterned in a fifth mask process to form a photoresist pattern 58. The photoresist pattern 58 covers the n-type region A2, the switching region A3 and the storage region A4. An ion doping process using p+ ions is performed for the p-type region A1. Side portions of the first polycrystalline semiconductor patterns 34 are doped with p+ ions. The ion-doped side portions of the first polycrystalline semiconductor pattern 34 have an ohmic contact property. The photoresist pattern 58 is then removed.

As shown in FIGS. 4F, 5F and 6F, an interlayer insulating film 60 is formed on the substrate 30 where the p+ doping process is completed. The gate insulating layer 46 and interlayer insulating film 60 are patterned in a sixth mask process to form first and second contact holes 62a and 62b exposing the ion-doped portions of the first polycrystalline semiconductor pattern 34, third and fourth contact holes 64a and 64b exposing the ion-doped portions of the second polycrystalline semiconductor pattern 36, and fifth and sixth contact holes 66a and 66b exposing the ion-doped portions of the third polycrystalline semiconductor pattern 38.

As shown in FIGS. 4G, 5G and 6G, a metallic material is deposited on the passivation layer 60 and patterned in a seventh mask process to form first source and drain electrodes 70a and 70b contacting the ion-doped portions of the first polycrystalline semiconductor pattern 34, second source and drain electrodes 72a and 72b contacting the ion-doped portions of the second polycrystalline semiconductor pattern 36, and third source and drain electrodes 74a and 74b contacting the ion-doped portions of the third polycrystalline semiconductor pattern 38. At the same time, a data line DL is formed, and a third storage electrode 76 extended from the third drain electrode 74b is formed in the storage region A4.

Through the above first to seventh mask processes, a CMOS device having an n-type driving thin film transistor and a p-type driving thin film transistor is formed in the non-display region D2. An n-type pixel thin film transistor is formed in the switching region A3 of the display region D1, and a pixel storage capacitor including a first storage capacitor C1 formed by the first and second electrodes 40 and 54 and a second storage capacitor C2 formed by the second and third electrodes 54 and 76 is formed.

As shown in FIGS. 4H, 5H and 6H, a passivation layer 78 is formed on the substrates 30 having the data line DL. The passivation layer 78 is patterned in an eighth mask process to form a drain contact hole 80 exposing the third storage electrode 76 (or the third drain electrode 74b).

As shown in FIGS. 4I, 5I and 6I, a transparent conductive material is deposited on the passivation layer 78 and patterned in a ninth mask process to form a pixel electrode 82. The pixel electrode 82 is connected to the third drain electrode 74b through the drain contact hole (80 of FIG. 6H).

Through the above first to ninth mask processes, the related art array substrate having the driving circuit directly formed thereon is fabricated. As the mask processes increases, product cost also increases and productivity decreases. Therefore, reduction of the mask processes is needed.

SUMMARY

A liquid crystal display device includes a p-type driving thin film transistor and an n-type driving thin film transistor in a non-display region of a substrate. The p-type driving thin film transistor includes a first polycrystalline semiconductor pattern, a first gate electrode, a first source electrode and a first drain electrode. The n-type driving thin film transistor includes a second polycrystalline semiconductor pattern, a second gate electrode, a second source electrode and a second drain electrode. The liquid crystal display device further comprises a gate line and a data line in a display region of the substrate that cross each other to define a pixel region, a pixel thin film transistor connected to the gate line and the data line. The pixel thin film transistor includes a third polycrystalline semiconductor pattern, a third gate electrode, a third source electrode and a third drain electrode. The liquid crystal display device further comprises a pixel electrode that covers and directly contacts the third drain electrode, a shield pattern that covers and directly contacts each of the first source electrode and the first drain electrode and the second source electrode and the second drain electrode, and a shield line that covers and directly contacts the data lines and the third source electrode.

In another aspect, a method of fabricating a liquid crystal display device includes forming first and second polycrystalline semiconductor patterns in p-type and n-type regions of a non-display region of a substrate, respectively, third and fourth polycrystalline semiconductor patterns in switching and storage regions of a display region of the substrate, respectively, and a storage pattern on the fourth polycrystalline semiconductor pattern. The fourth polycrystalline semiconductor pattern is extended from the third polycrystalline pattern. The method of fabricating a liquid crystal display device further includes forming a gate insulating layer on the first to fourth polycrystalline semiconductor patterns, and forming a first gate electrode in the p-type region, a first metal pattern in the n-type region, a second metal pattern in the switching and storage regions, a gate line connected to the second metal pattern on the gate insulating layer. The method of fabricating a liquid crystal display device further comprises doping first source and drain portions of the first polycrystalline semiconductor pattern with p+ ions after forming the first gate electrode and the first and second metal patterns, and forming a second gate electrode from the first metal pattern in the n-type region, and a third gate electrode and a first storage electrode from the second metal pattern in the switching and storage regions, respectively. The method of fabricating a liquid crystal display device also includes doping second source and drain portions of the second polycrystalline semiconductor patterns and third source and drain portions of the third polycrystalline semiconductor patterns with n+ ions after forming the second and third gate electrodes and the first storage electrode, forming an interlayer insulating film on the first to third gate electrodes and the first storage electrode, and forming a contact hole of the interlayer insulating film exposing each of the first source and drain portions, the second source and drain portions, the third source portion, and one of the third drain portion, the fourth polycrystalline semiconductor pattern and the storage pattern. The method of fabricating a liquid crystal display device further comprises forming source and drain electrodes in each of the n-type, p-type and switching regions, a second storage electrode in the storage region, and a data line connected to the source electrode of the switching region, on the interlayer insulating film, and forming a pixel electrode on the drain electrode of the switching region and the second storage electrode, a shield pattern on the source and drain electrodes of the n-type and p-type regions, and a shield line on the data line and the source electrode of the switching region.

In another aspect, a liquid crystal display device includes a p-type driving thin film transistor and an n-type driving thin film transistor in a non-display region of a substrate, and a pixel thin film transistor in a display region of the substrate. Each of the p-type, n-type and pixel thin film transistors includes a polycrystalline semiconductor pattern, a gate electrode on the polycrystalline semiconductor pattern, and a source electrode and a drain electrode on the gate electrode. The liquid crystal display device further includes a gate insulating layer between the polycrystalline semiconductor pattern and the gate electrode, an interlayer insulating film between the gate electrode and the source electrode and the drain electrode, and a gate line and a data line that cross each other to define a pixel region of the display region. The liquid crystal display device further comprises a pixel electrode in the pixel region, and a storage capacitor connected to the pixel thin film transistor. The storage capacitor includes a first storage electrode that has a storage polycrystalline semiconductor pattern extended from the polycrystalline semiconductor pattern of the pixel thin film transistor and a storage pattern directly on the storage polycrystalline semiconductor pattern, a second storage electrode on the gate insulating layer, and a third storage electrode extended from the drain electrode of the pixel thin film transistor.

It is to be understood that both the foregoing general description and the following detailed description are exemplary and explanatory and are intended to provide further explanation of the invention as claimed.

DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 5A to 5I are plan views illustrating fabrication processes in a display region of the related art array substrate.

DETAILED DESCRIPTION

Reference will now be made in detail to the illustrated embodiments of the present invention, which are illustrated in the accompanying drawings.

Figure 1:
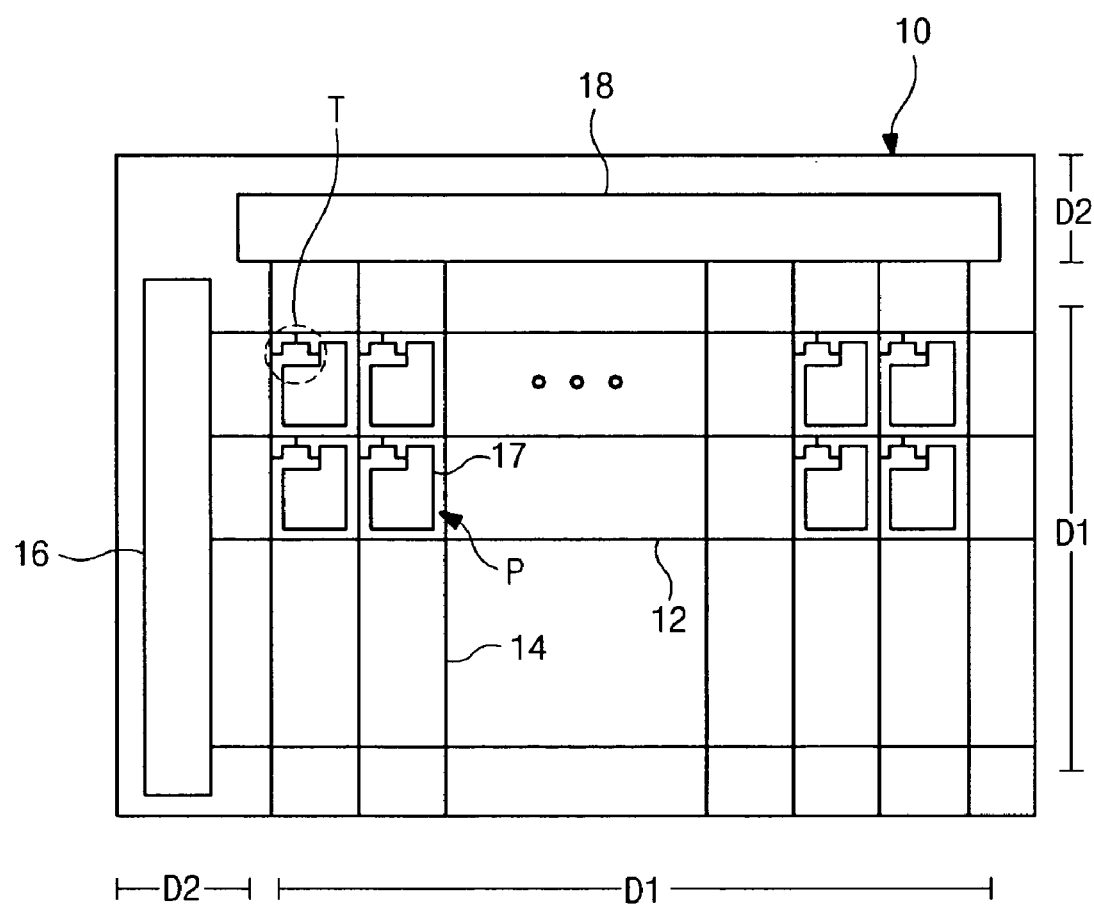
FIG. 1 is a schematic plan view of an array substrate for an LCD device according to the related art.
Figure 2:
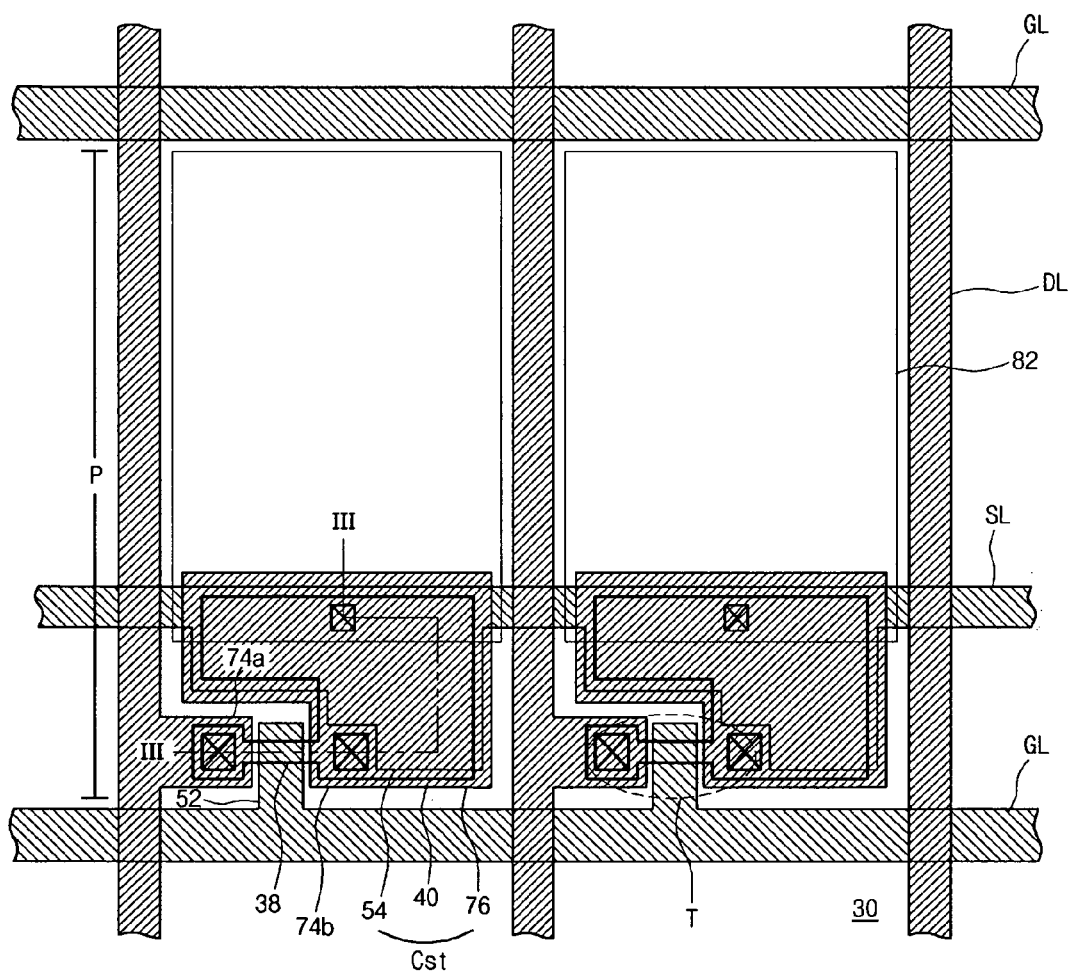
FIG. 2 is a plan view of a display region of an array substrate for an LCD device of FIG. 1.
Figure 3A:
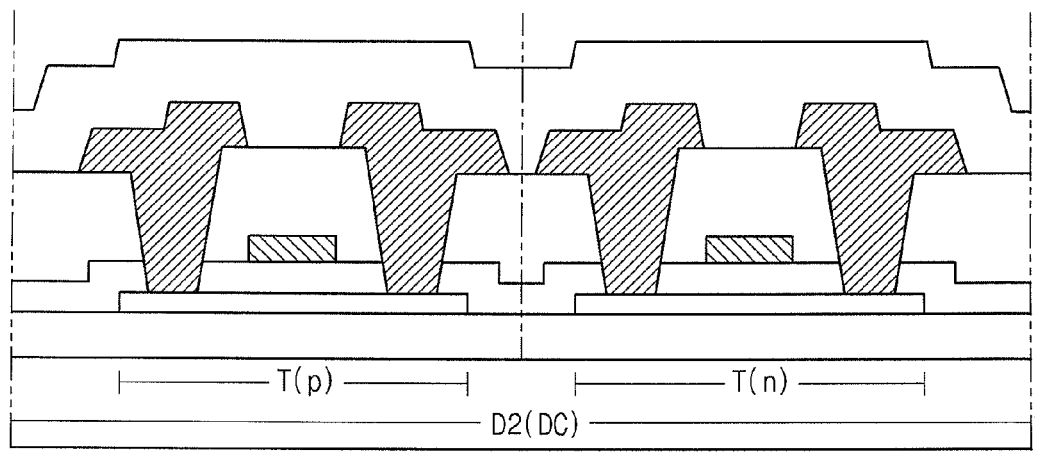
FIG. 3A is a cross-sectional view of a portion of a driving circuit for an LCD device of FIG. 1.
Figure 3B:
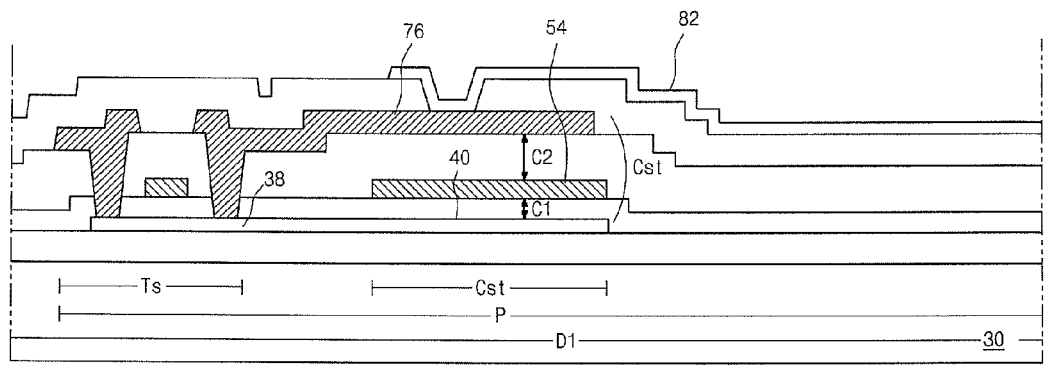
FIG. 3B is a cross-sectional view taken along a line II-II of FIG. 2.
Figure 4A:
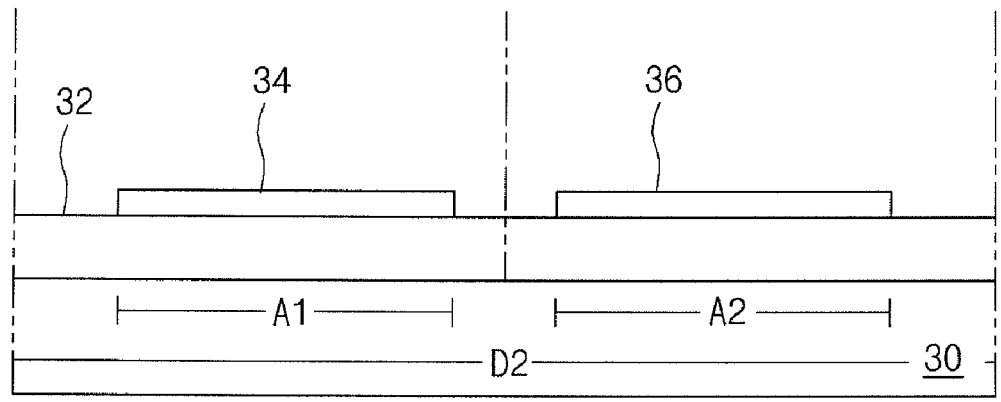
FIGS. 4A to 4I are cross-sectional views illustrating fabrication processes in a non-display region of the related art array substrate.
Figure 4B:
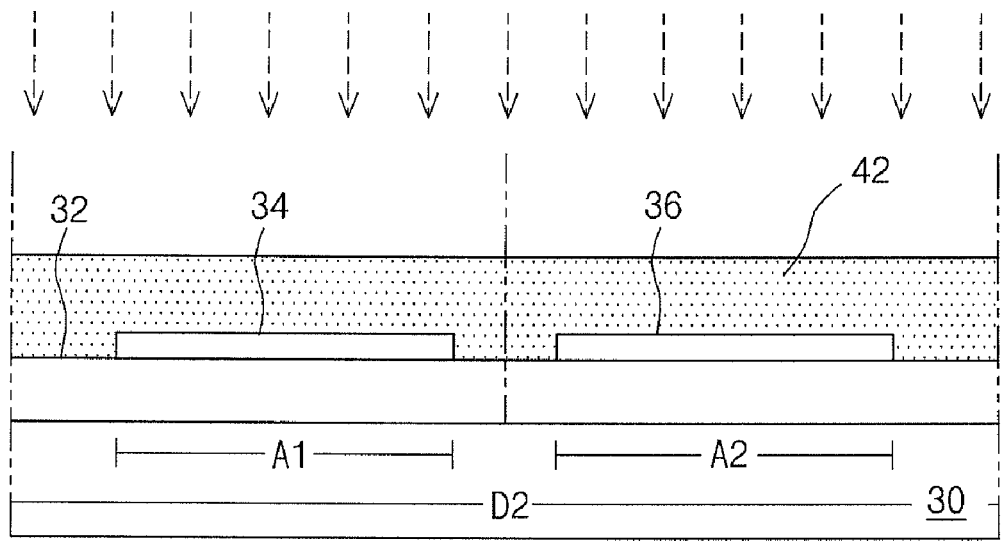
Figure 4C:
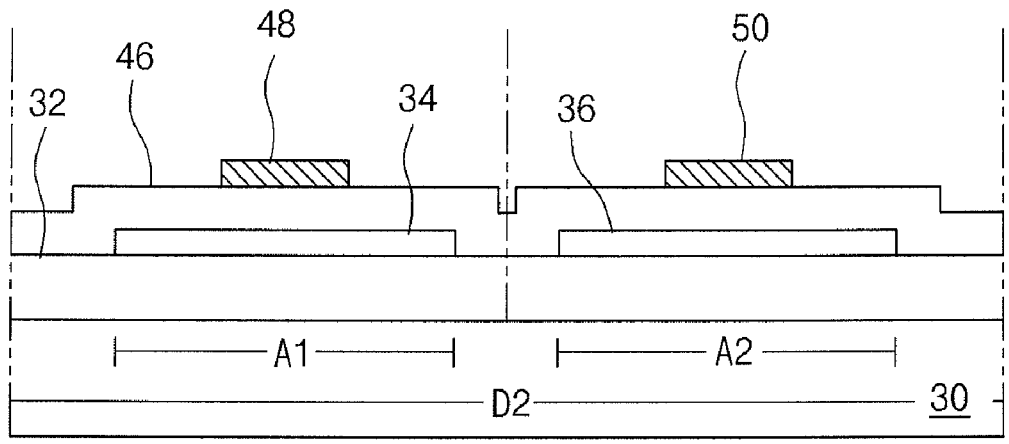
Figure 4D:
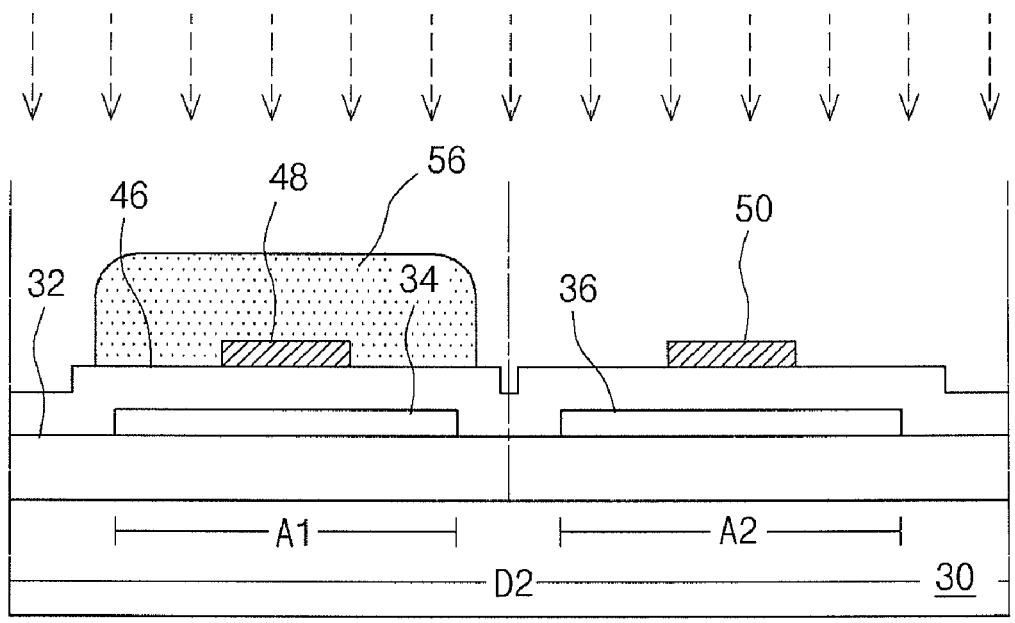
Figure 4E:
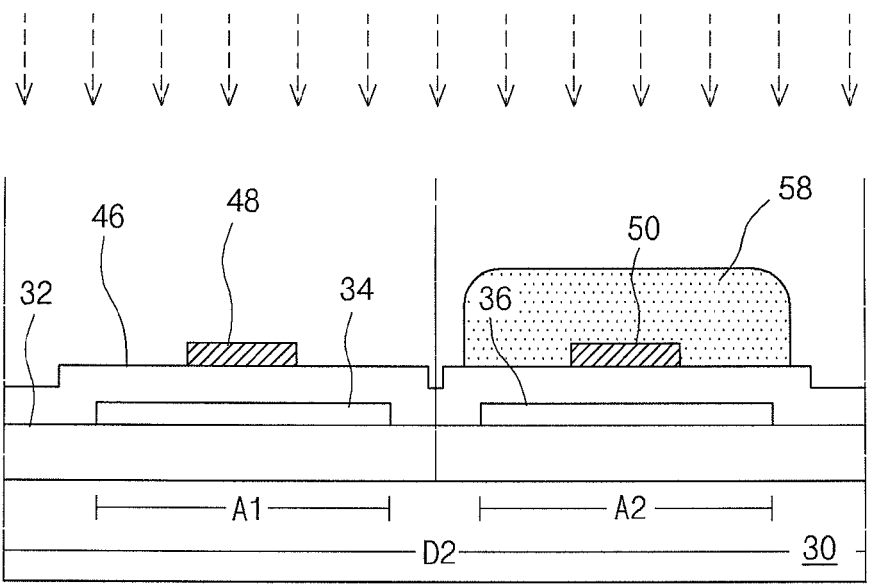
Figure 4F:
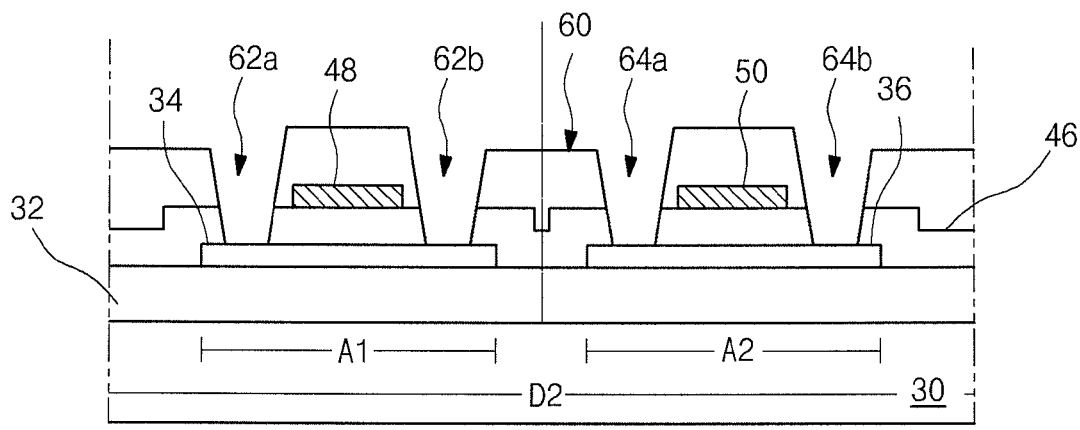
Figure 4G:
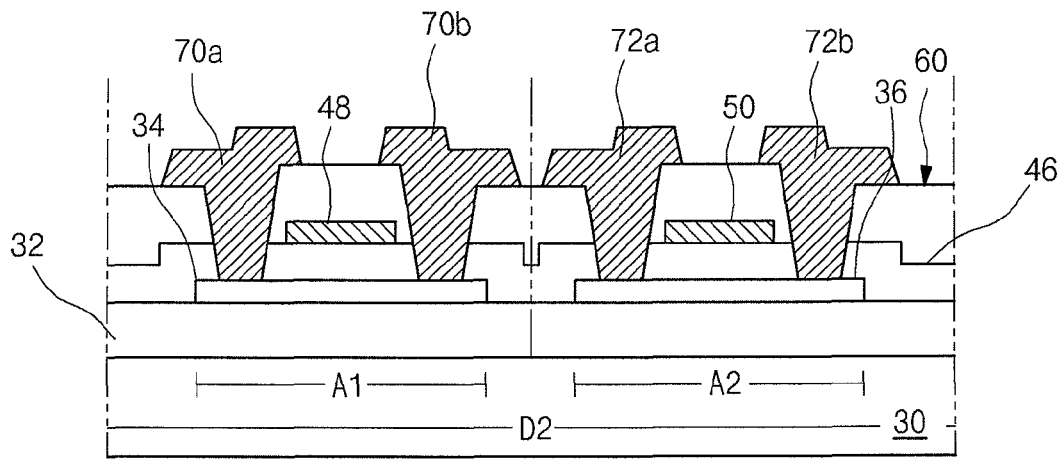
Figure 4H:
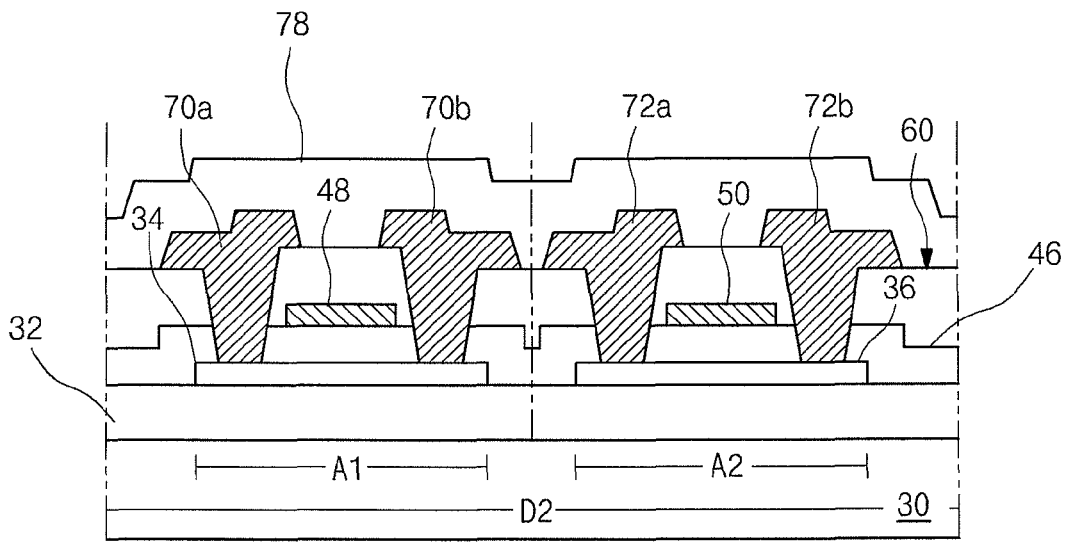
Figure 4I:
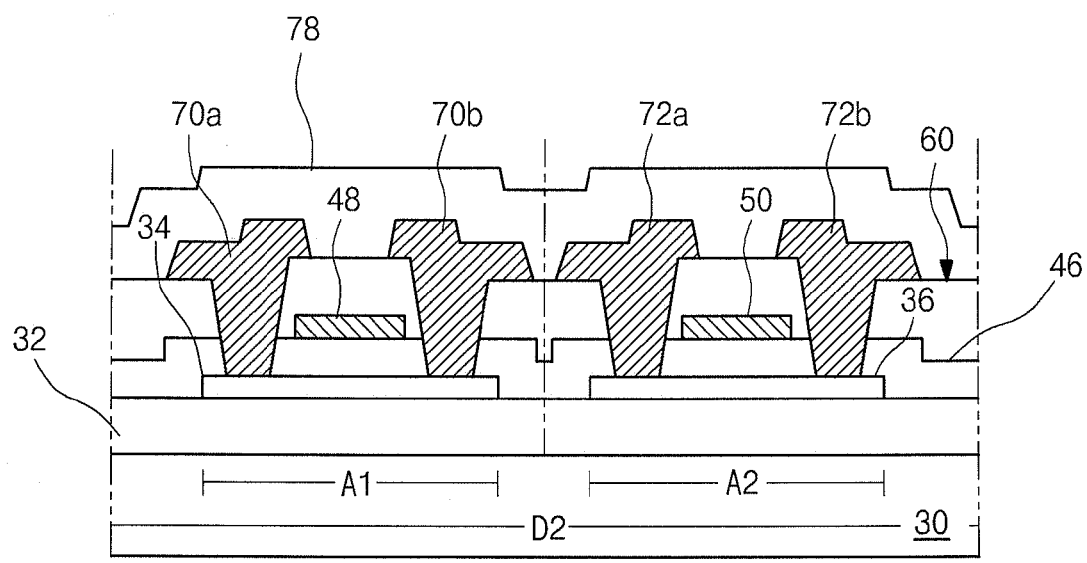
Figure 5A:
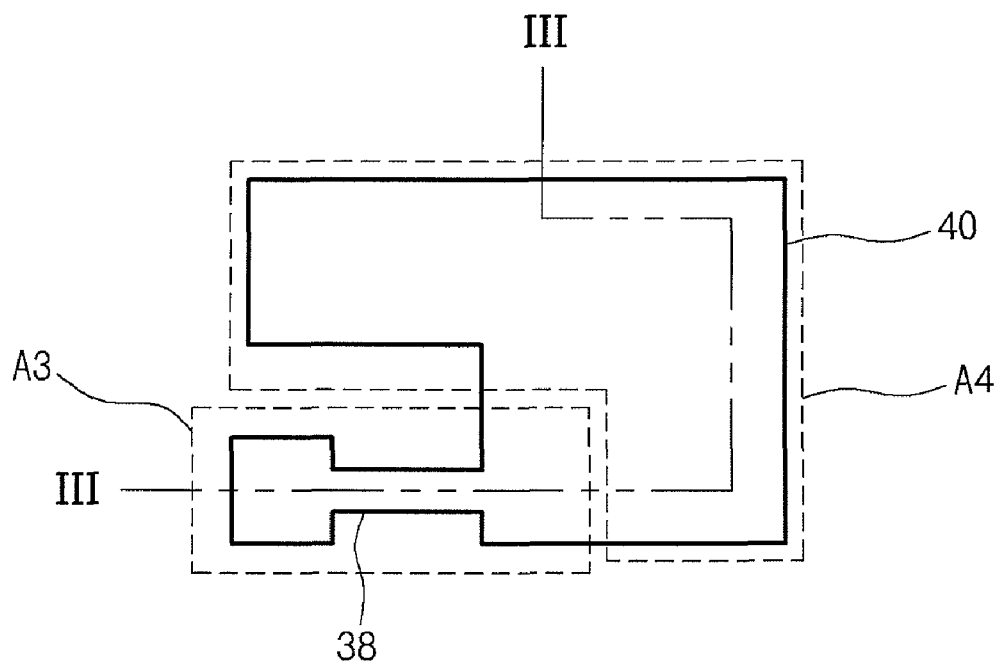
Figure 5B:
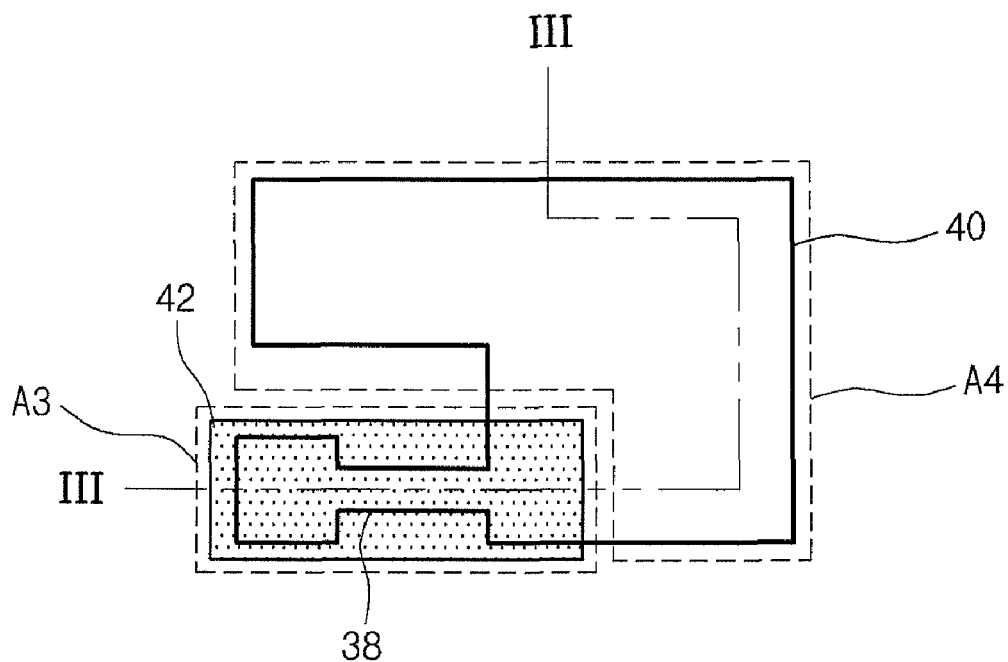
Figure 5C:
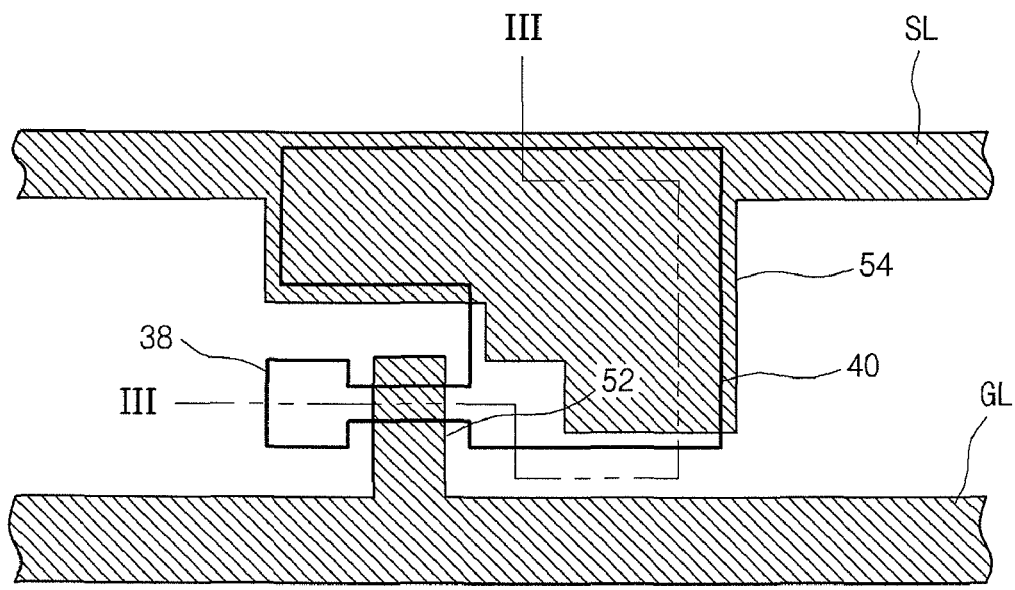
Figure 5D:
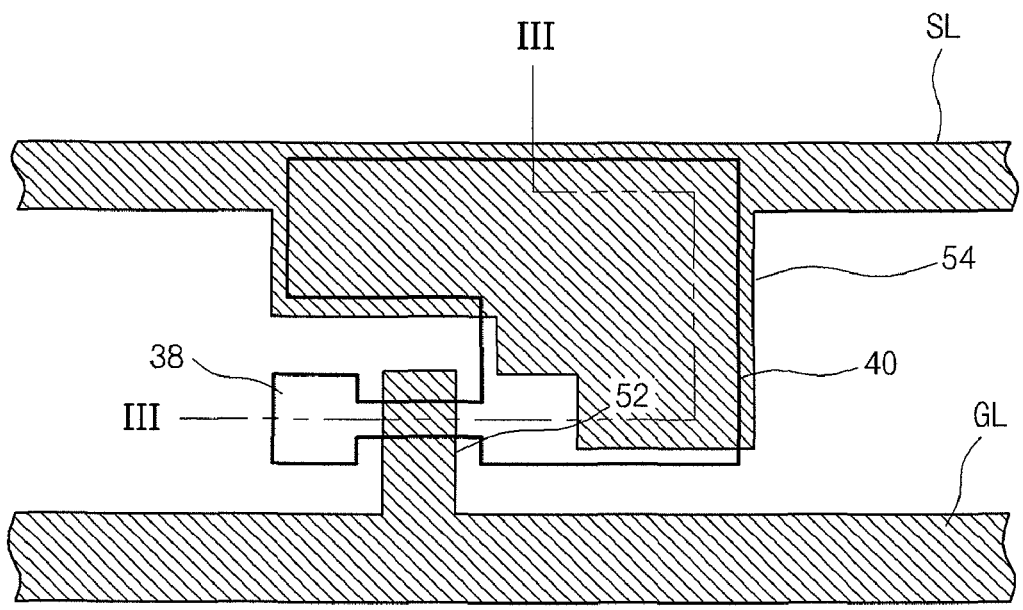
Figure 5E:
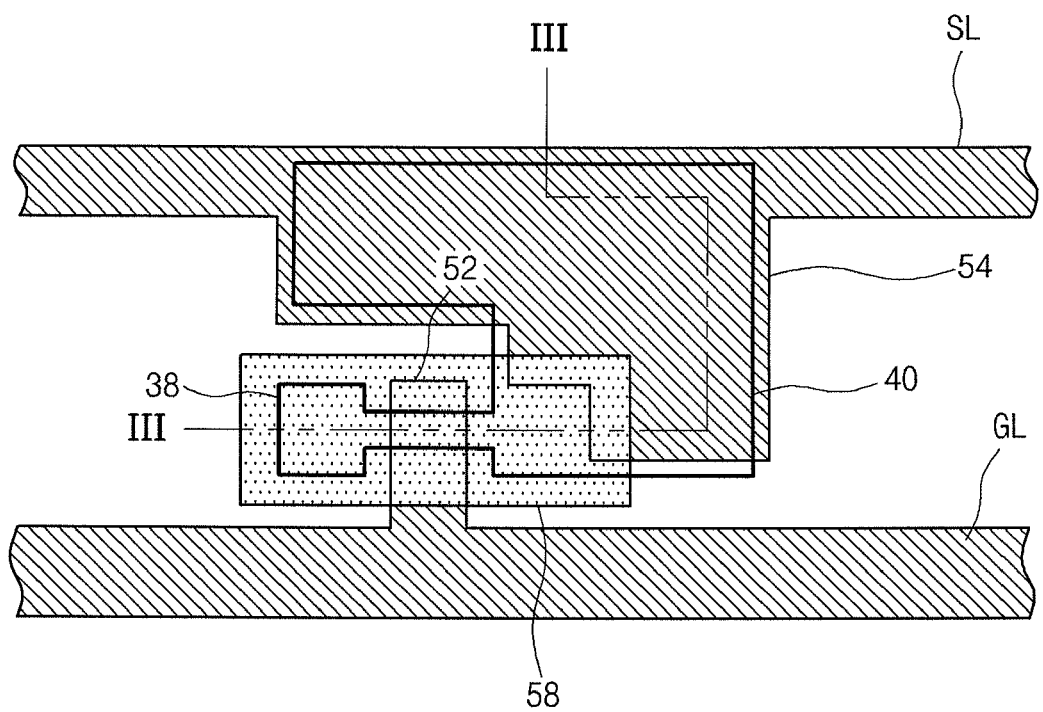
Figure 5F:
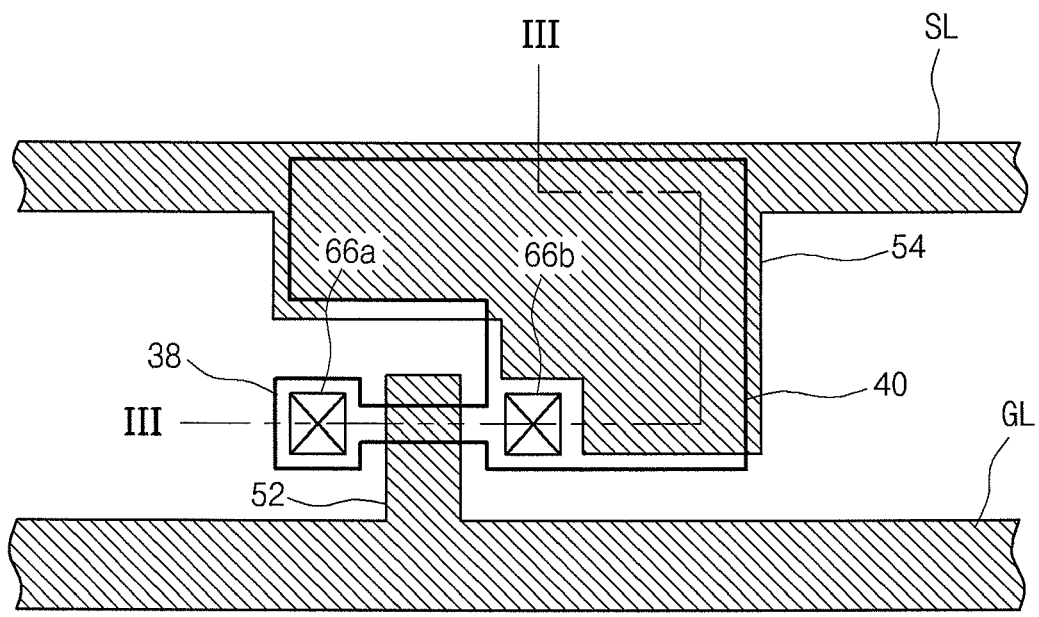
Figure 5G:
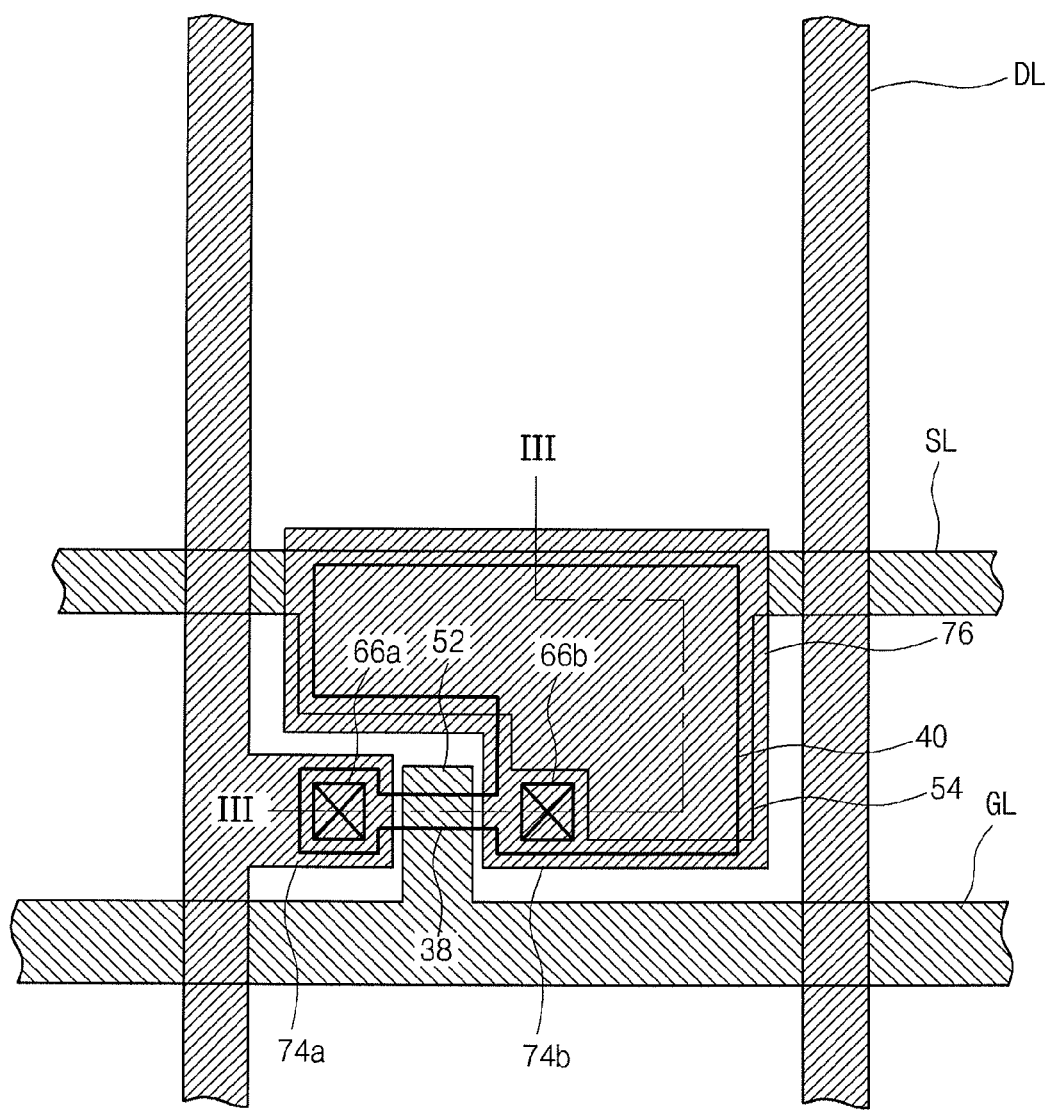
Figure 5H:
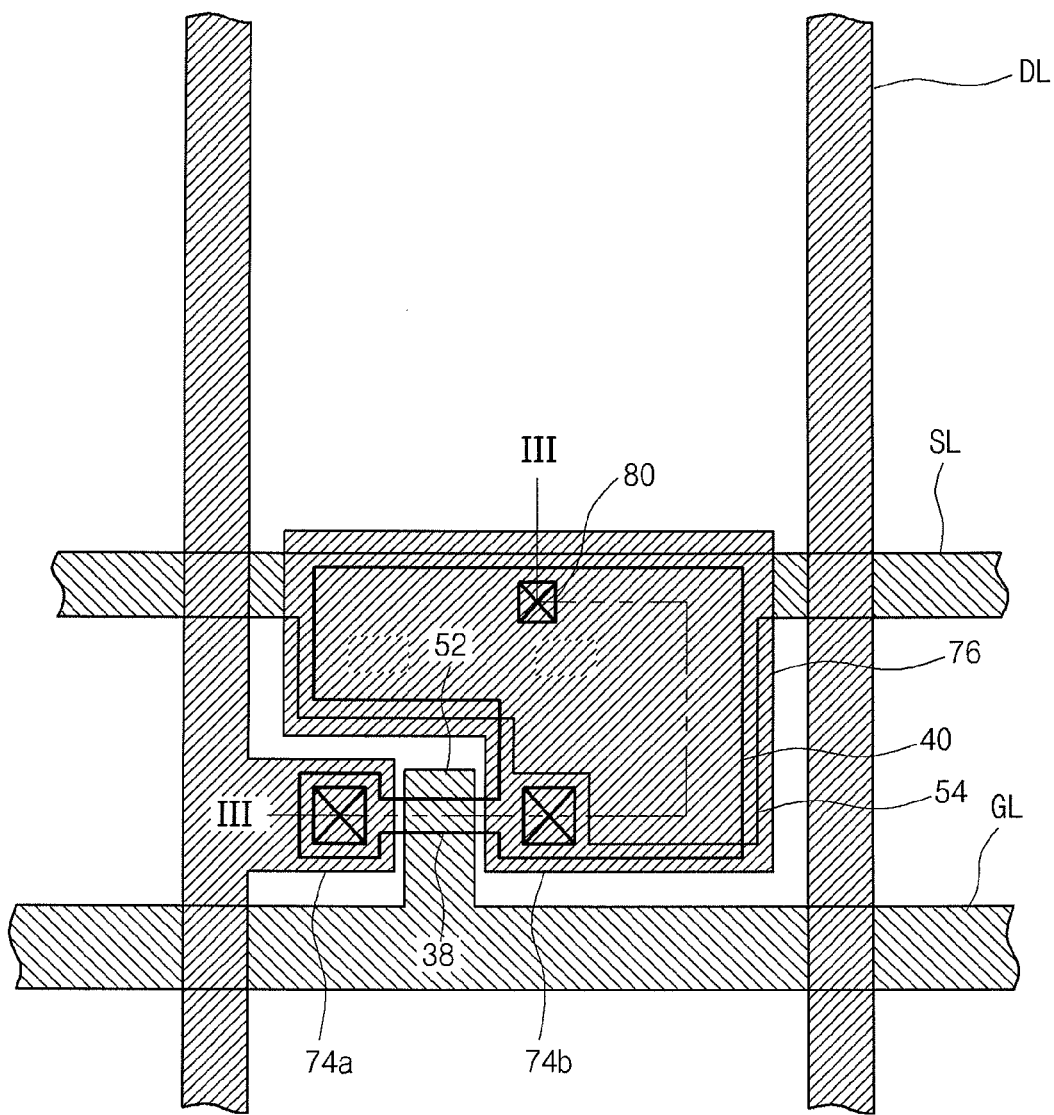
Figure 6A:
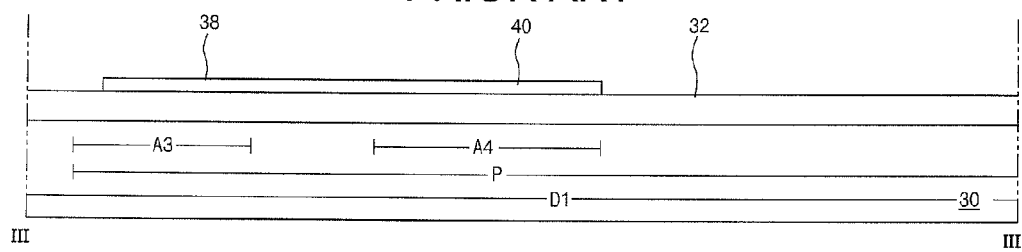
FIGS. 6A to 6I are cross-sectional views taken along lines III-III of FIGS. 5A to 5I, respectively.
Figure 6B:
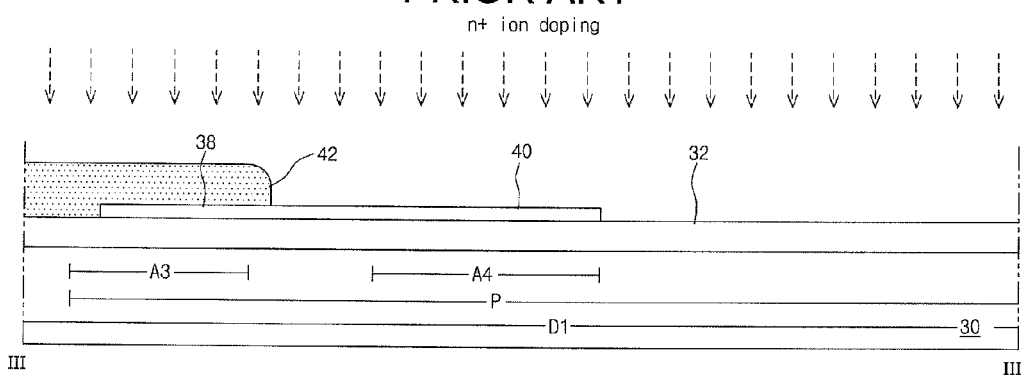
Figure 6C:
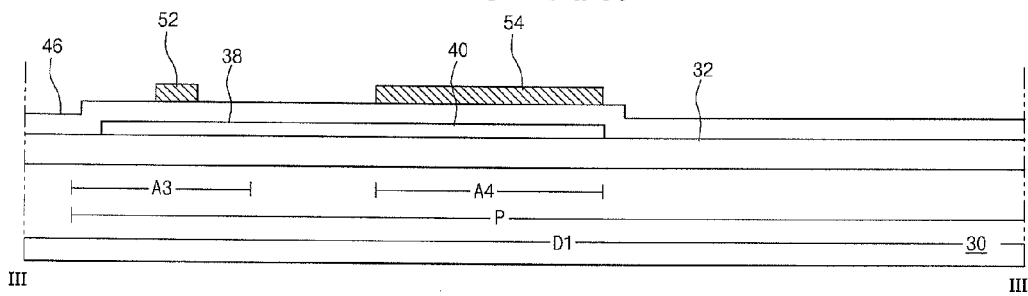
Figure 6D:
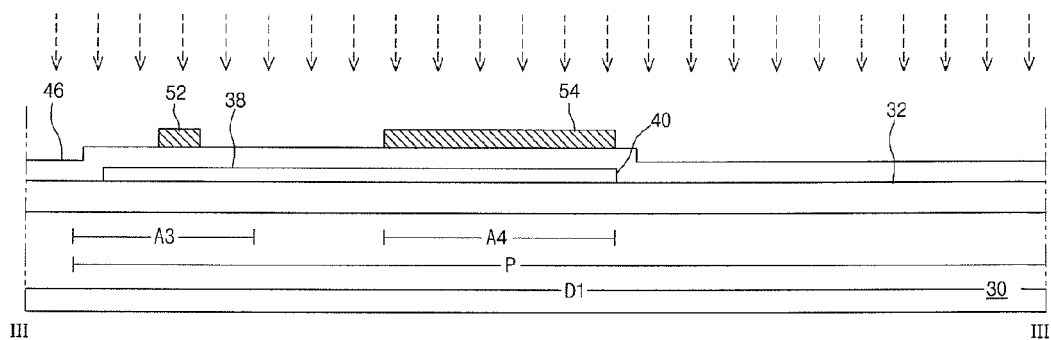
Figure 6E:
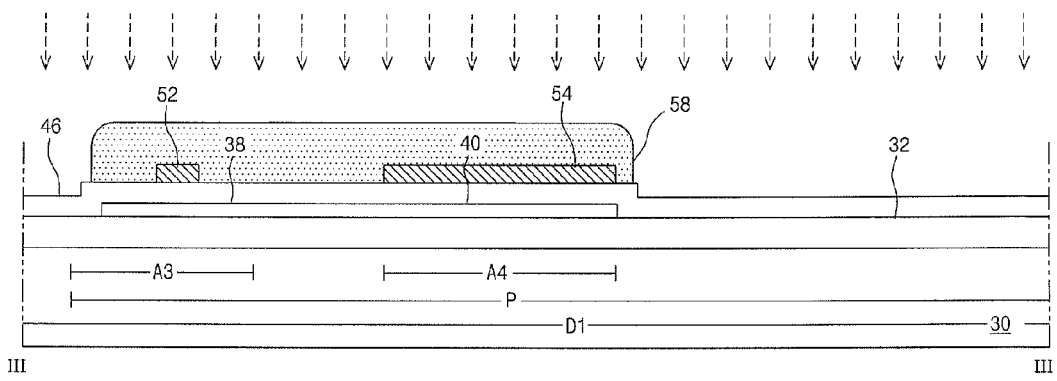
Figure 6F:
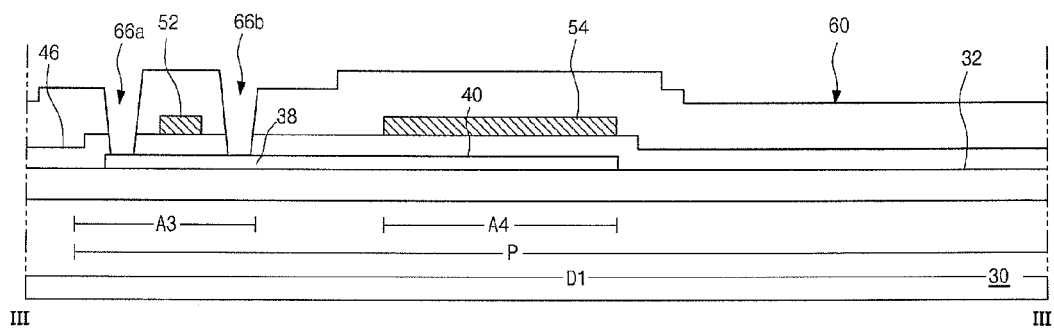
Figure 6G:
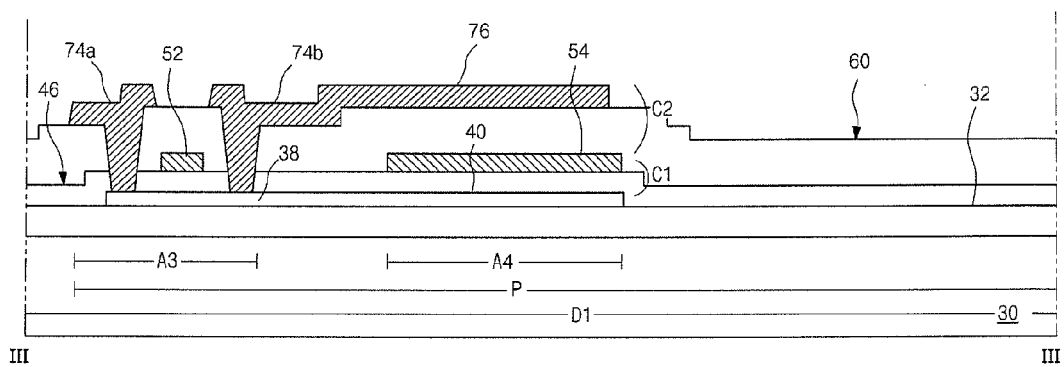
Figure 6H:
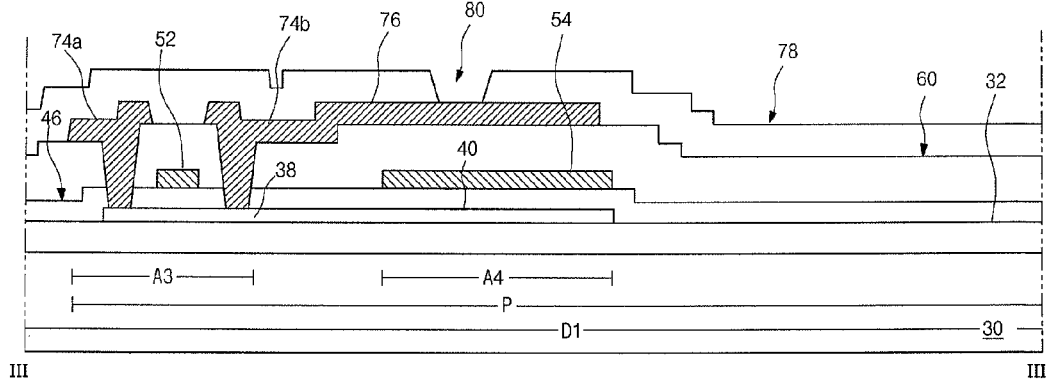
Figure 6I:
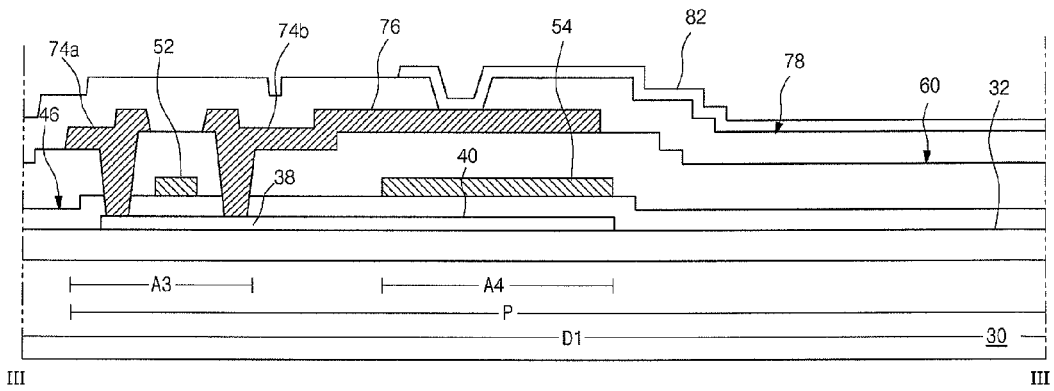
Figure 7:
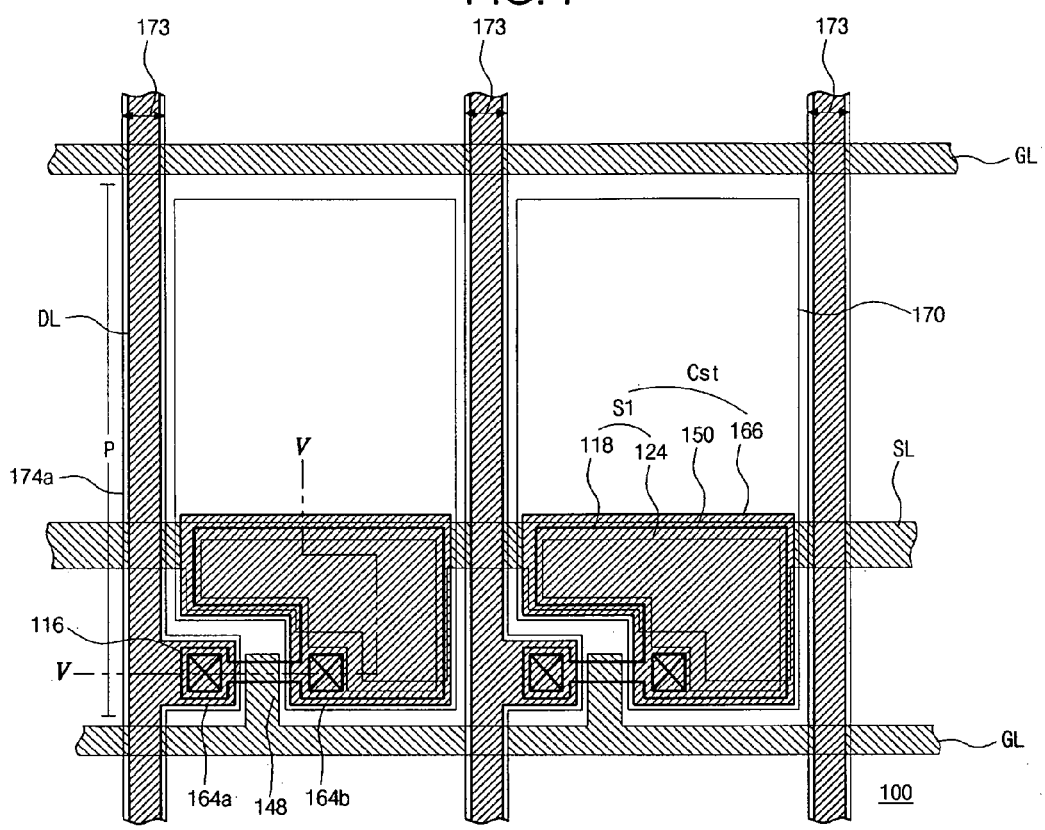
FIG. 7 is a plan view of a display region of an array substrate for an LCD device according to an exemplary embodiment of the present invention.

FIG. 7 is a plan view of a display region of an array substrate for an LCD device according to an exemplary embodiment of the present invention.

As shown in FIG. 7, on a substrate 100, a gate line GL is extended along a first direction, and a data line DL is extended along a second direction. The gate line GL and the data line DL cross each other to define a pixel region P. A storage line SL is spaced aparat from the gate line GL and extended along the first direction.

A pixel thin film transistor is disposed at a crossing portion of the gate and data lines GL and DL. The pixel thin film transistor includes a gate electrode 148, a polycrystalline semiconductor pattern 116, a source electrode 164a and a drain electrode 164b.

A pixel electrode 170 is disposed in the pixel region P and directly contacts the drain electrode 164b without a contact hole.

A storage capacitor Cst including first, second and third storage electrodes S1, 150 and 166 is disposed in the pixel region P. The first storage electrode S1 has a storage portion 118 extended from the polycrystalline semiconductor pattern 116 and a storage pattern 124. The second storage electrode 150 is extended from the storage line SL. The third storage electrode 166 is extended from the drain electrode 164b.

The pixel electrode 170 covers the drain electrode 164b and the third storage electrode 166. A shield line 173 is disposed at the same layer as the pixel electrode 170 and covers the data line DL and the source electrode 164a.

Figure 8A:
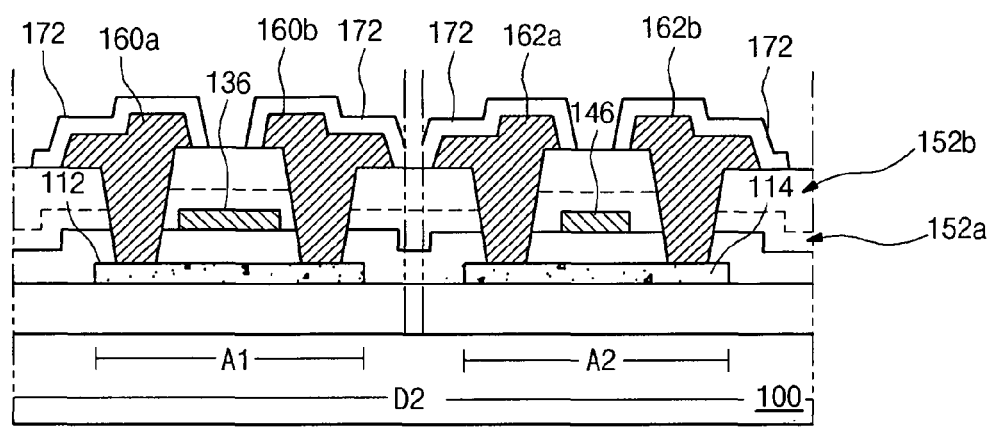
FIG. 8A is a cross-sectional view of a non-display region of a driving circuit of an array substrate for an LCD device according to an exemplary embodiment of the present invention.
Figure 8B:
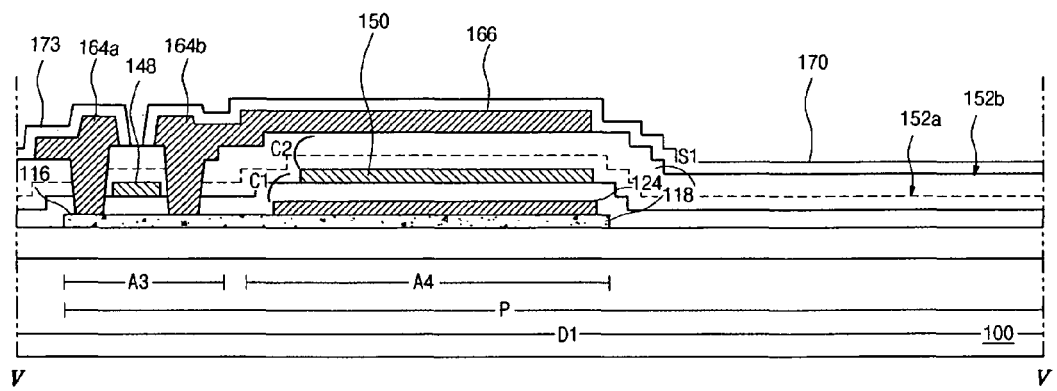
FIG. 8B is a cross-sectional view taken along a line V-V of FIG. 7.

FIG. 8A is a cross-sectional view of a non-display region of a driving circuit of an array substrate for an LCD device according to an exemplary embodiment of the present invention, and FIG. 8B is a cross-sectional view taken along a line V-V of FIG. 7.

As shown in FIGS. 8A and 8B, an array substrate includes a display region D1 and a non-display region D2. A driving circuit (a gate or data driving circuit) in the non-display region D2 includes a CMOS device, and the CMOS device includes a p-type driving thin film transistor in a p-type region A1 and an n-type driving thin film transistor in an n-type region. The p-type driving thin film transistor includes a first gate electrode 136, a first polycrystalline semiconductor pattern 112 and first source and drain electrodes 160a and 160b. The n-type driving thin film transistor includes a second gate electrode 146, a second polycrystalline semiconductor pattern 114 and second source and drain electrodes 162a and 162b. A shield pattern 172 is disposed directly on and covers each of the first source and drain electrodes 160a and 160b and the second source and drain electrodes 162a and 162b.

In a pixel region P of the display region D1, a pixel thin film transistor, a pixel electrode 170 and a pixel storage capacitor are disposed. The pixel thin film transistor is disposed in a switching region A3 and includes a third gate electrode 148, a third polycrystalline semiconductor pattern 116 and third source and drain electrodes 164a and 164b. A shield line 173 is directly on and covers the data line (DL of FIG. 7) and the third source electrode 164a. A pixel electrode 170 is disposed in the pixel region P and is directly on and covers the drain electrode 164b and a third storage electrode 166.

The pixel storage capacitor is disposed in a storage region A4 and includes first and second storage capacitors C1 and C2. First and second storage electrodes S1 and 150 form the first storage capacitor C1, and the second and third storage electrodes 150 and 166 form the second storage capacitor C2. The first and second storage capacitors C1 and C2 are connected in parallel. The first storage electrode S1 includes a fourth polycrystalline semiconductor pattern 118 and a storage pattern 124 on the fourth polycrystalline semiconductor pattern 118. The fourth polycrystalline semiconductor pattern 118 is formed in one body with the third polycrystalline semiconductor pattern 116. The third storage electrode 166 is also formed in one body with the third drain electrode 164b.

An interlayer insulating film includes two layers, a first layer 152a made of silicon oxide ($SiO_2$) and a second layer 152b made of silicon nitride (SiNx). The second layer 152b made of silicon nitride (SiNx) contacts the pixel electrode 170.

Figure 9A:
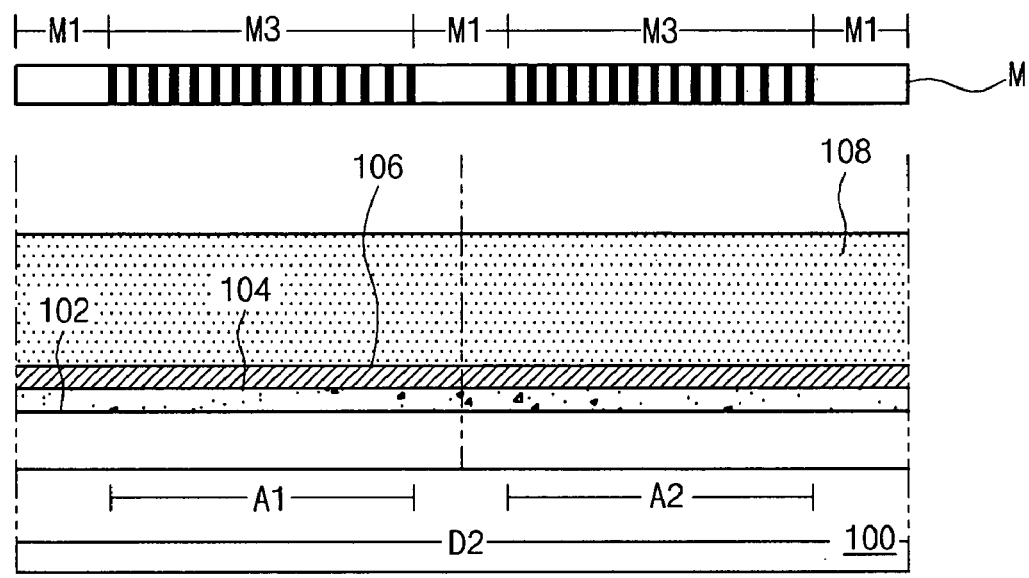
FIGS. 9A to 9N are cross-sectional views illustrating fabrication processes in a non-display region of an array substrate according to the exemplary embodiment of the present invention.
Figure 9B:
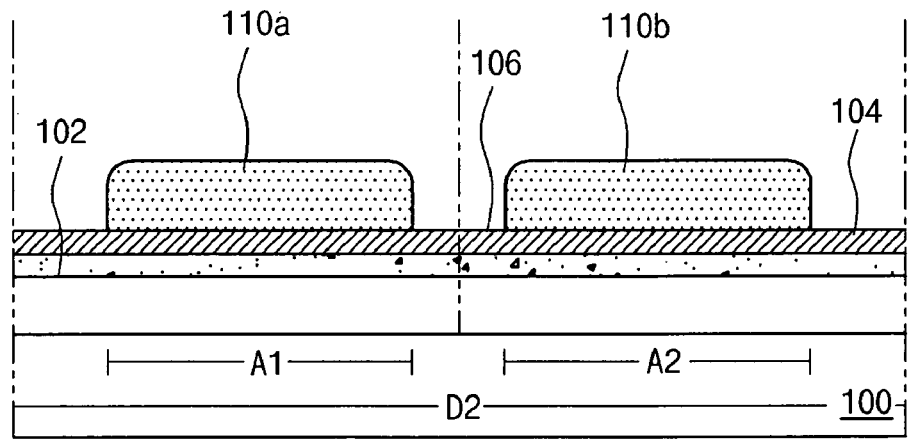
Figure 9C:
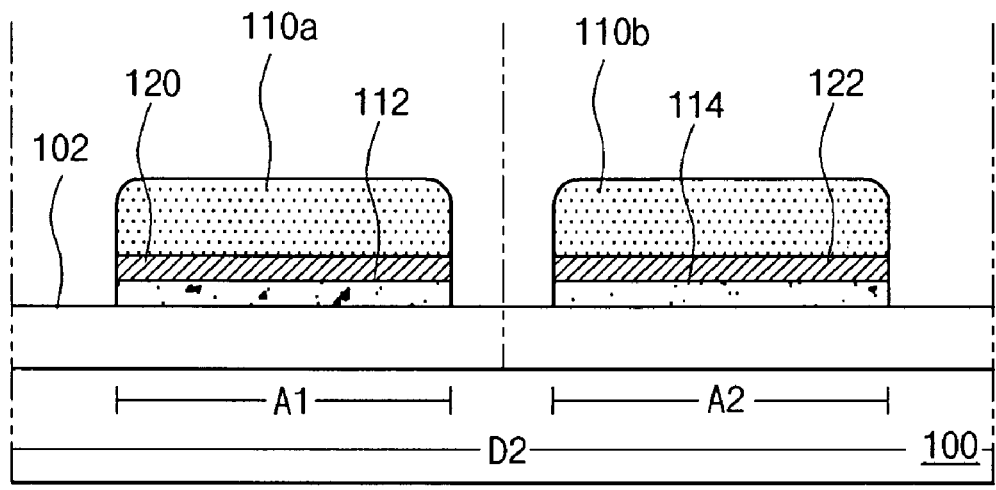
Figure 9D:
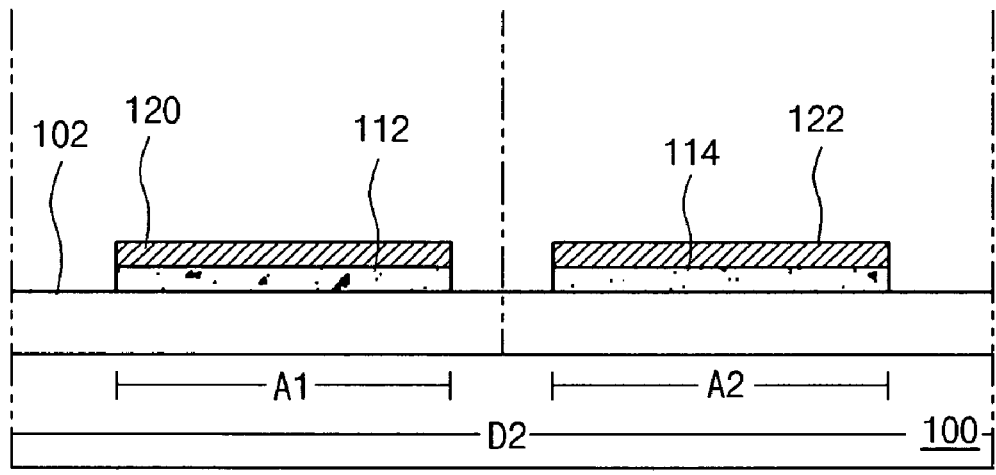
Figure 9E:
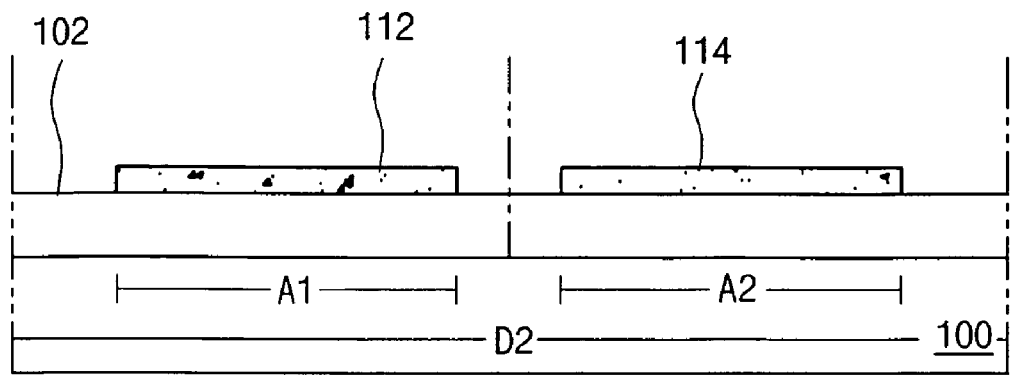
Figure 9F:
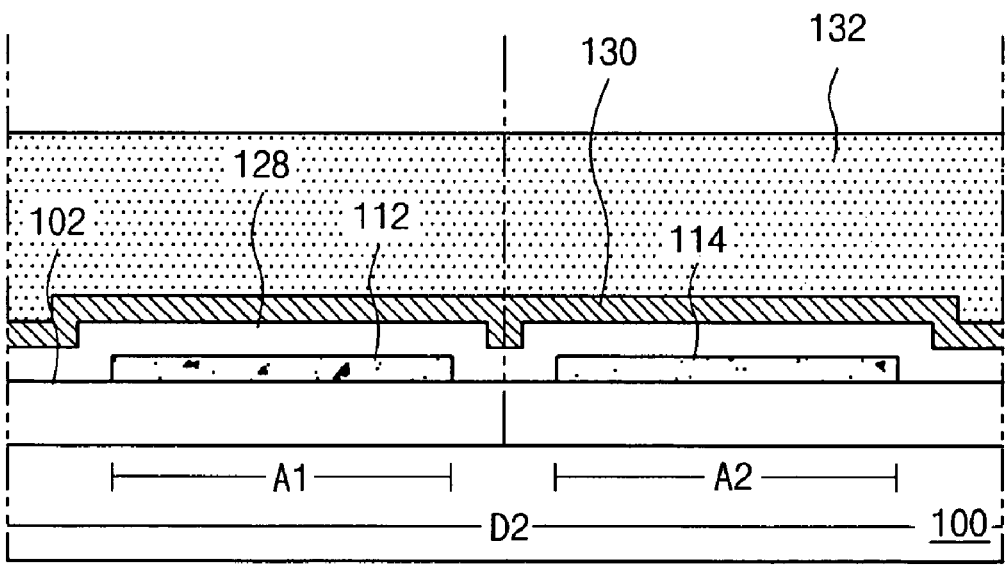
Figure 9G:
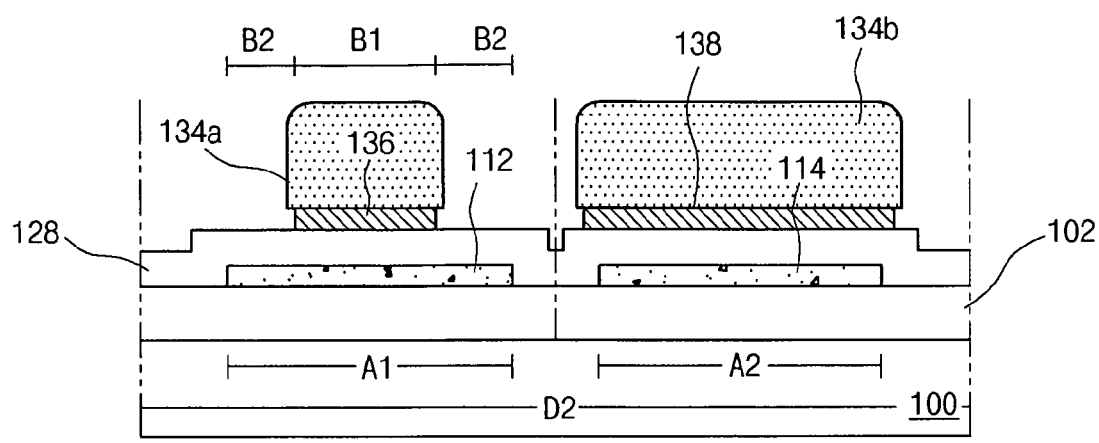
Figure 9H:
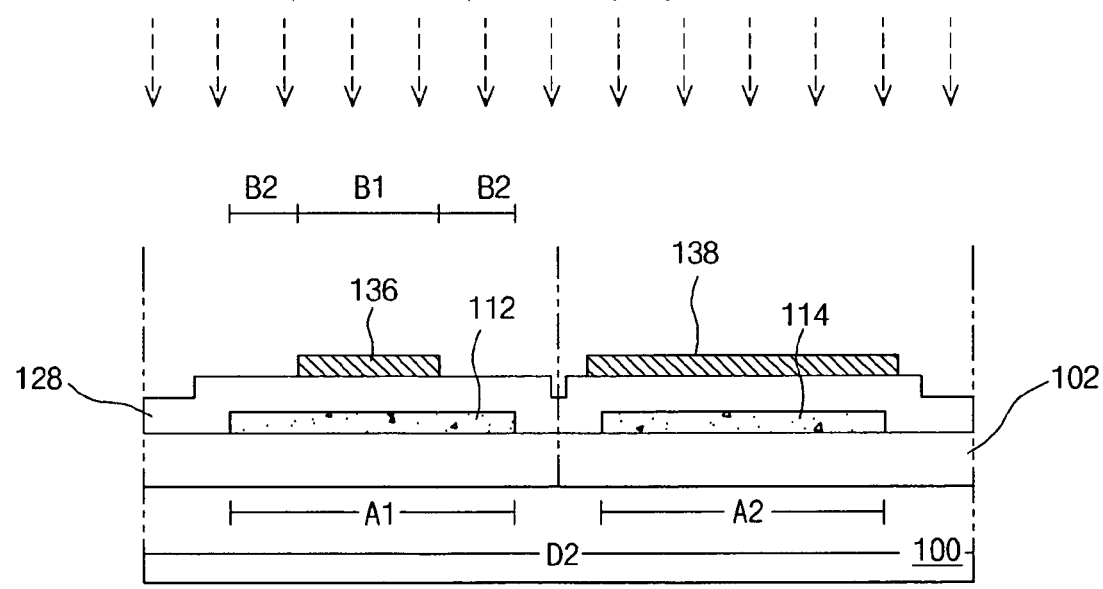
Figure 9I:
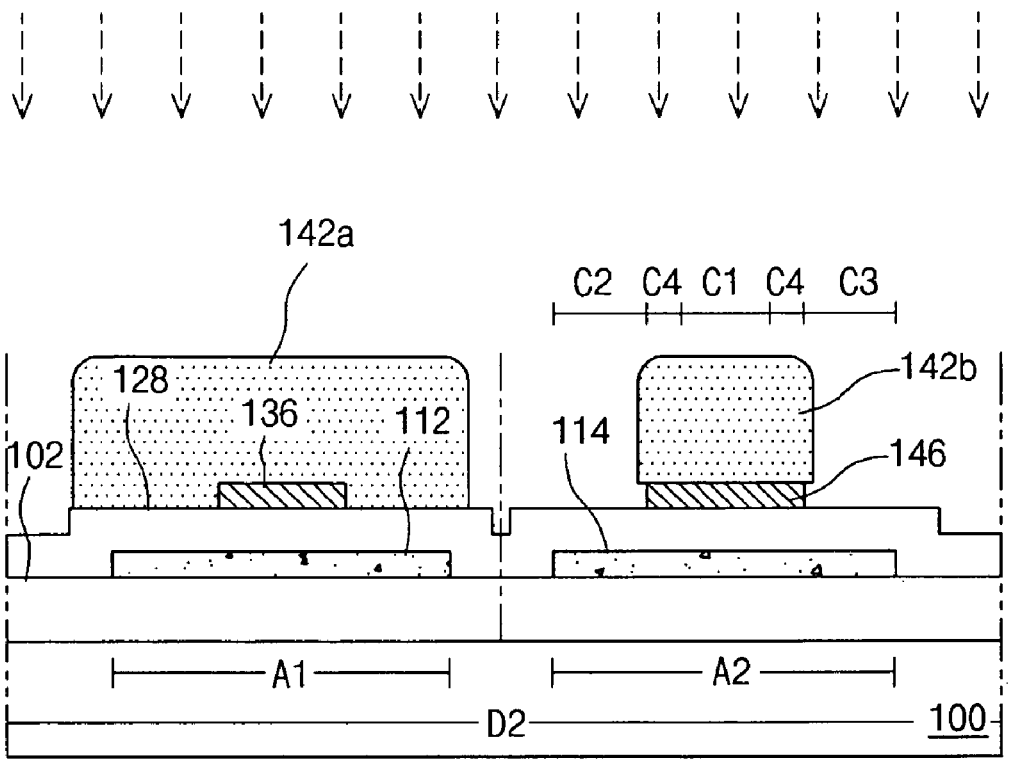
Figure 9J:
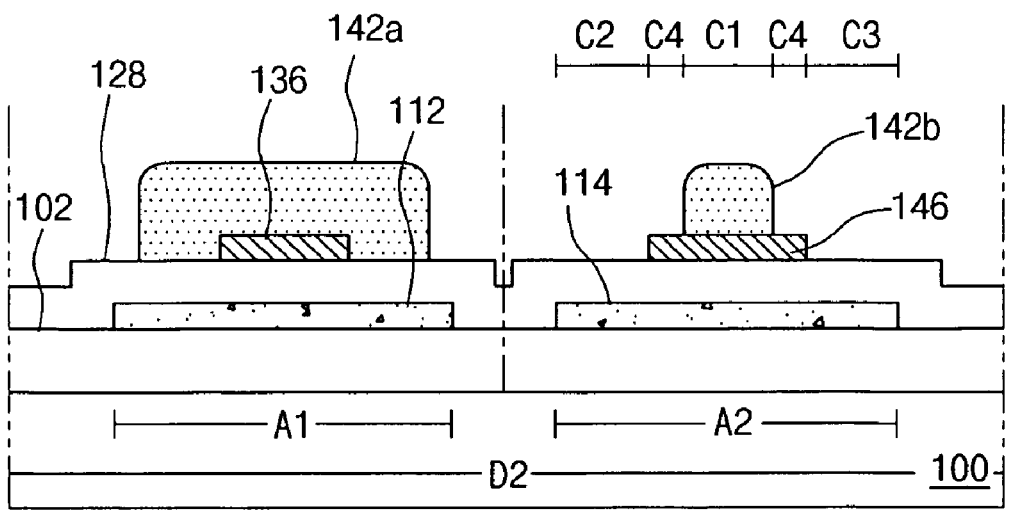
Figure 9M:
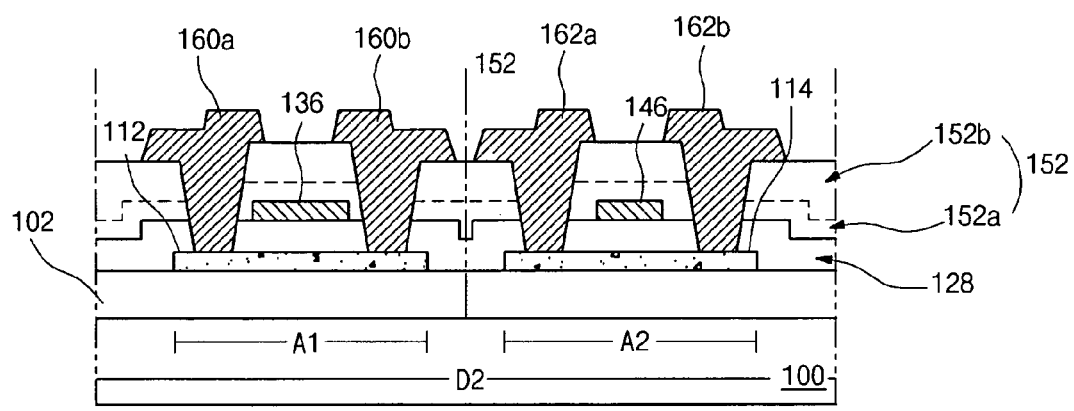
Figure 9N:
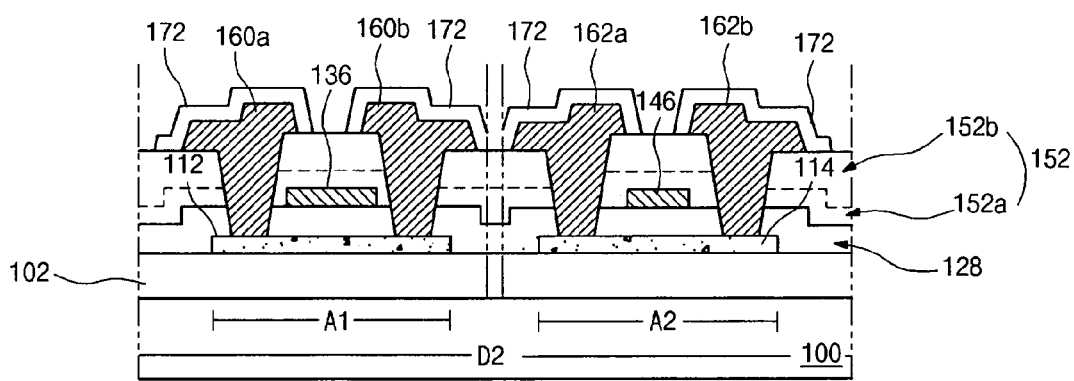
Figure 10A:
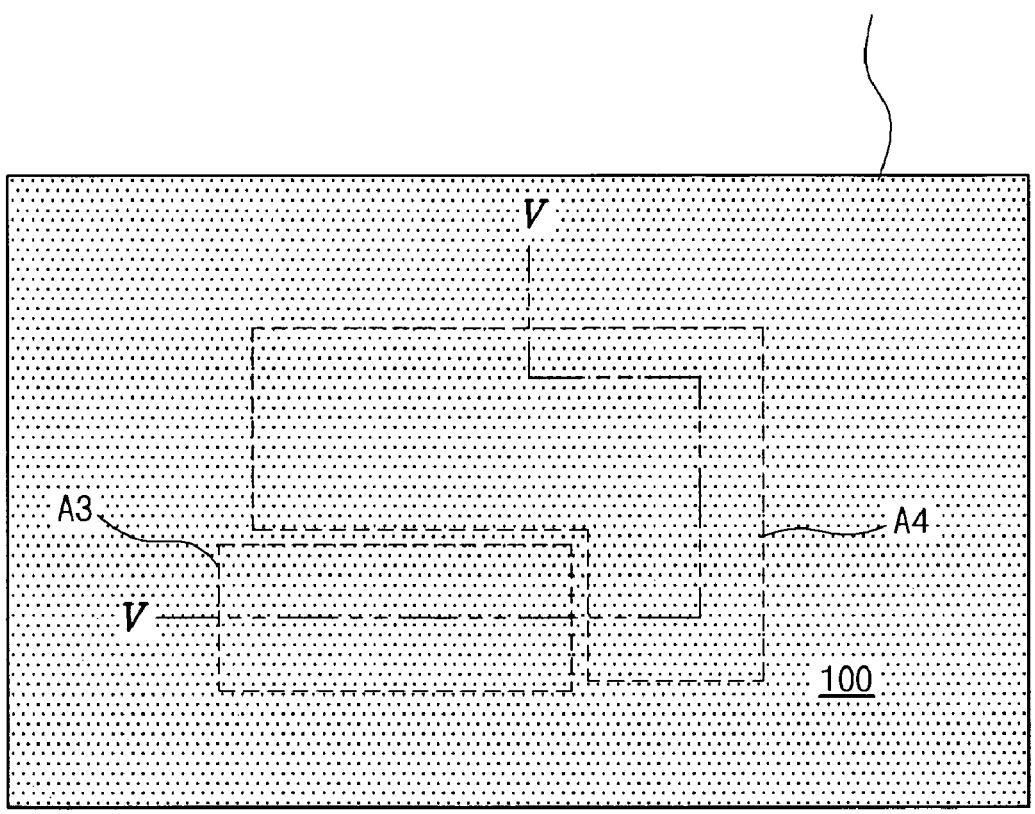
FIGS. 10A to 10N are plan views illustrating fabrication processes in a display region of an array substrate according to the exemplary embodiment of the present invention.
Figure 10B:
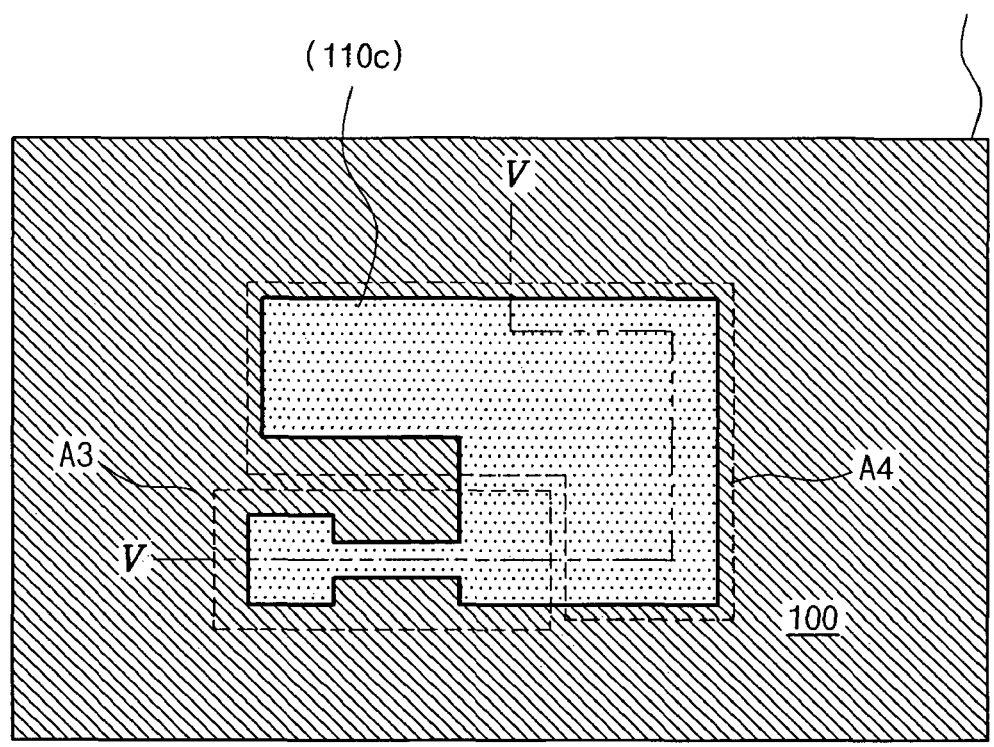
Figure 10C:
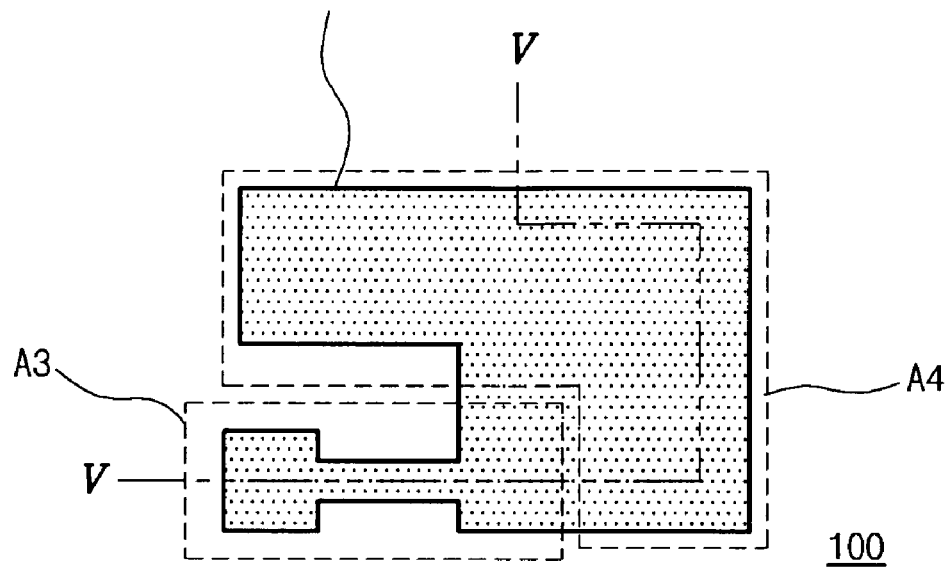
Figure 10D:
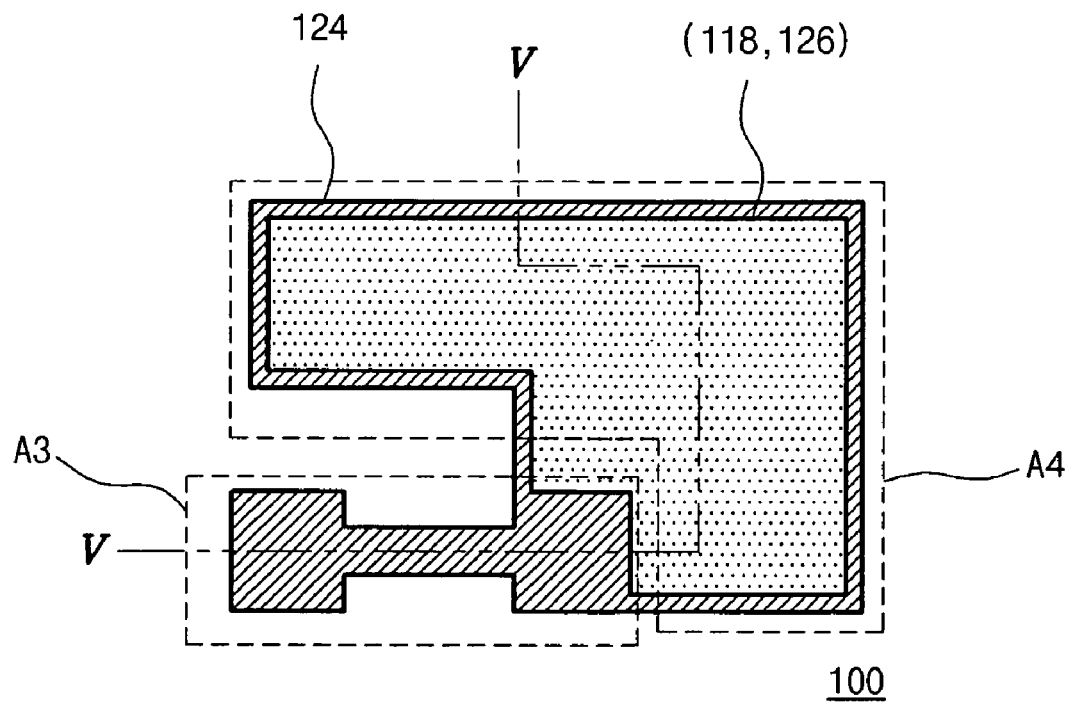
Figure 10E:
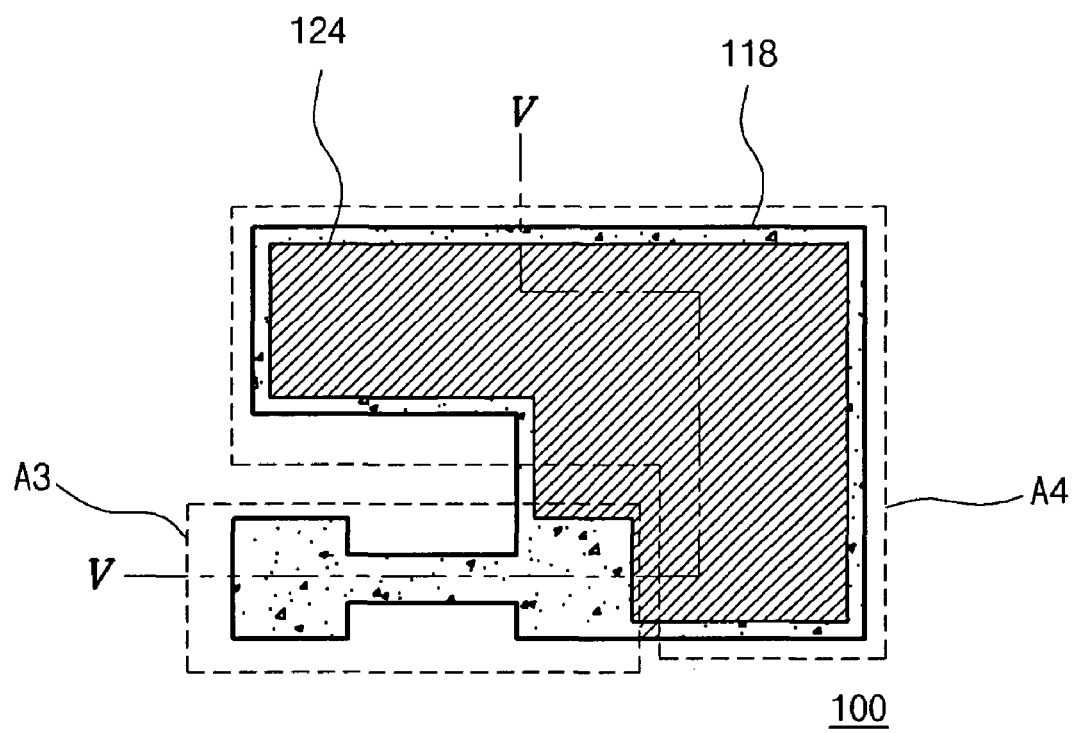
Figure 10F:
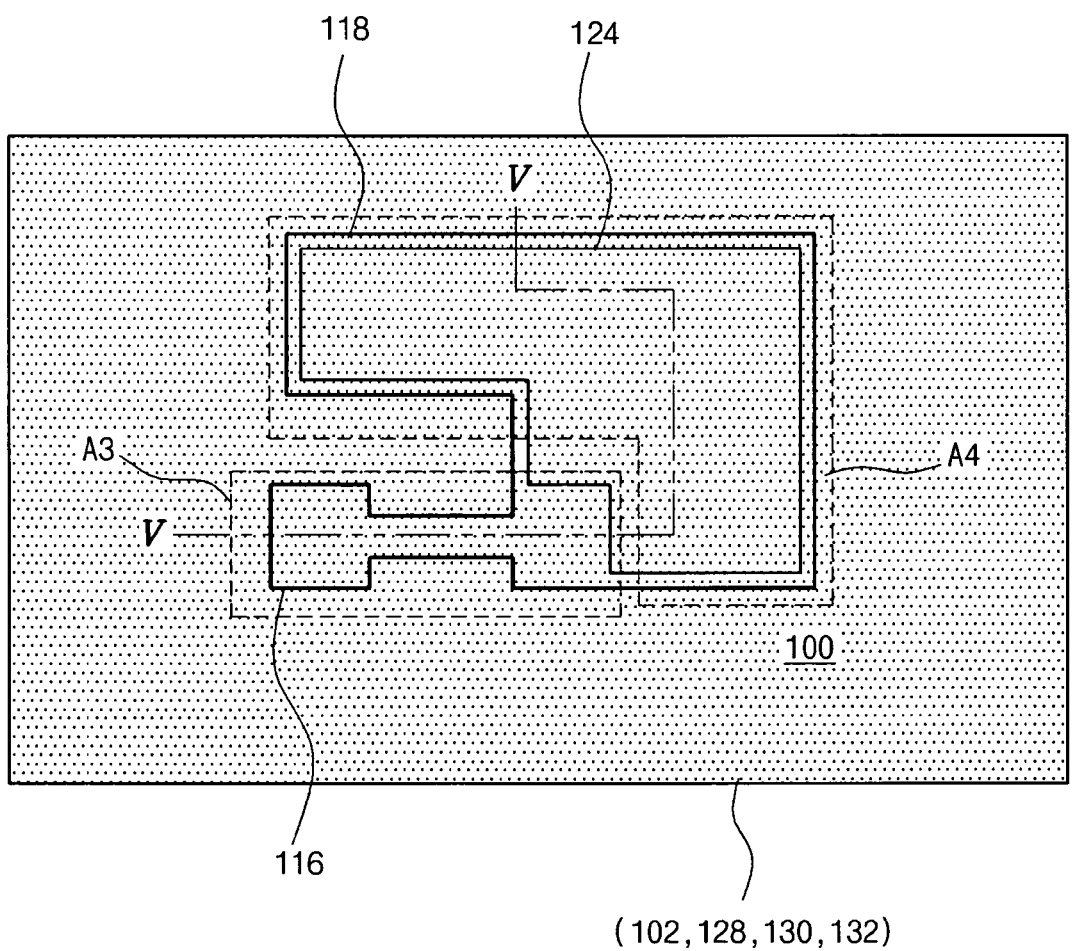
Figure 10G:
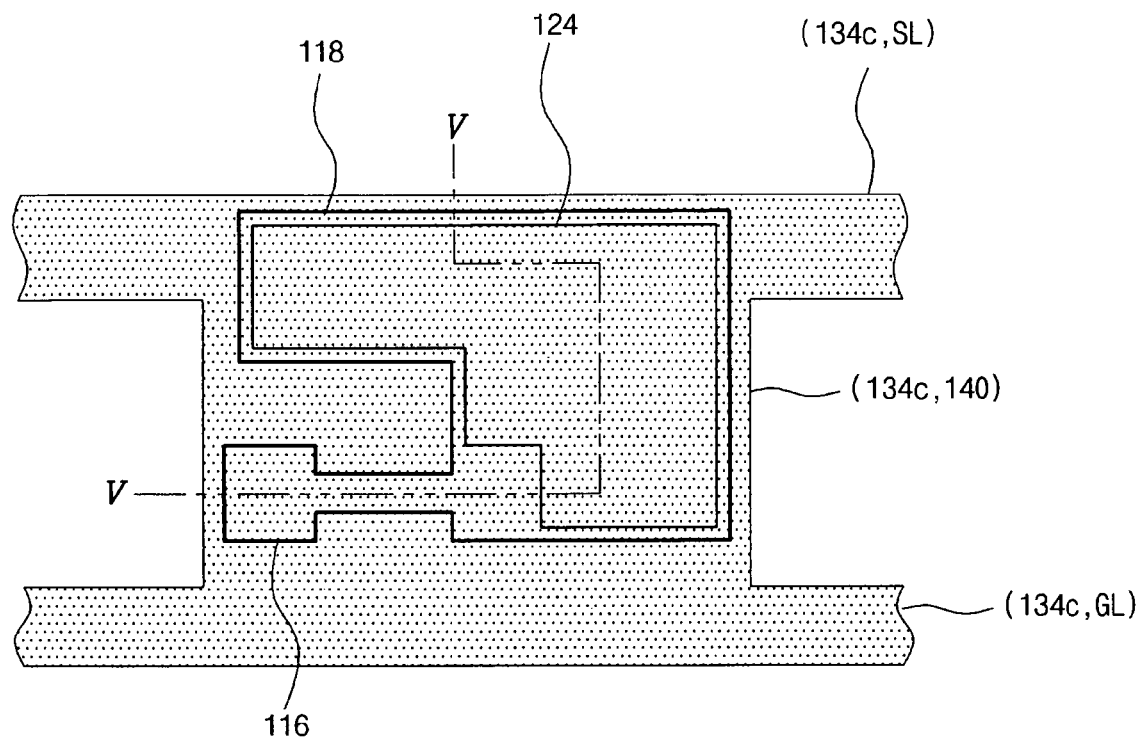
Figure 10H:
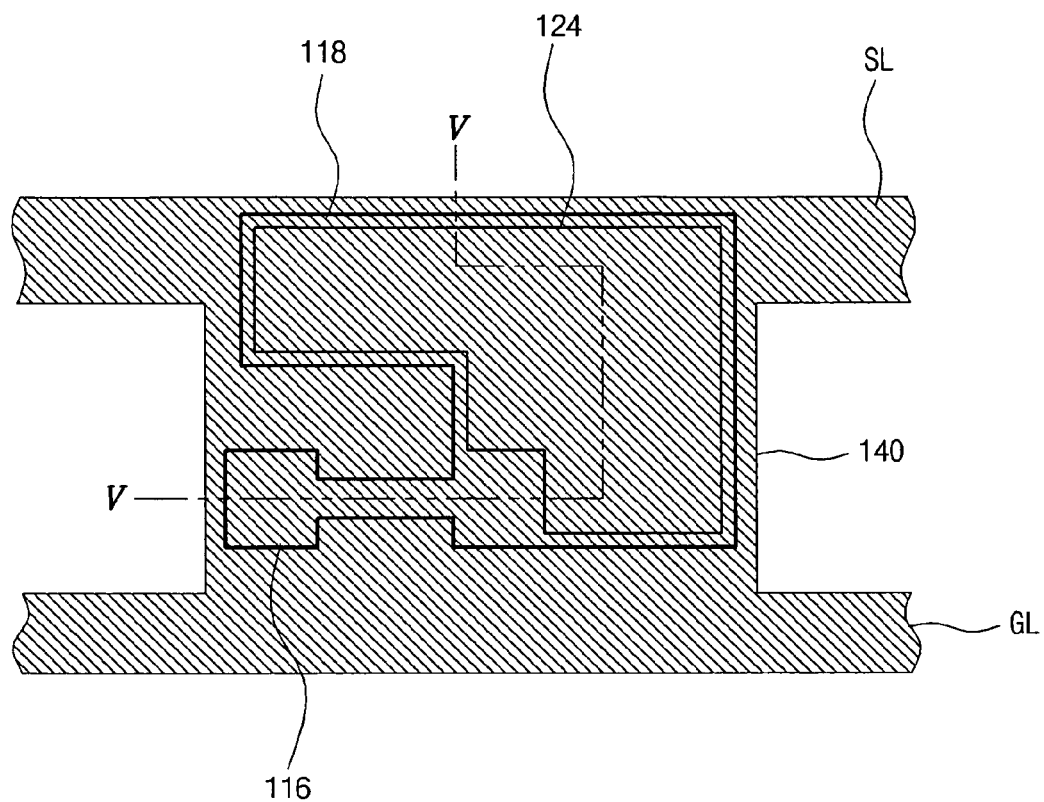
Figure 10I:
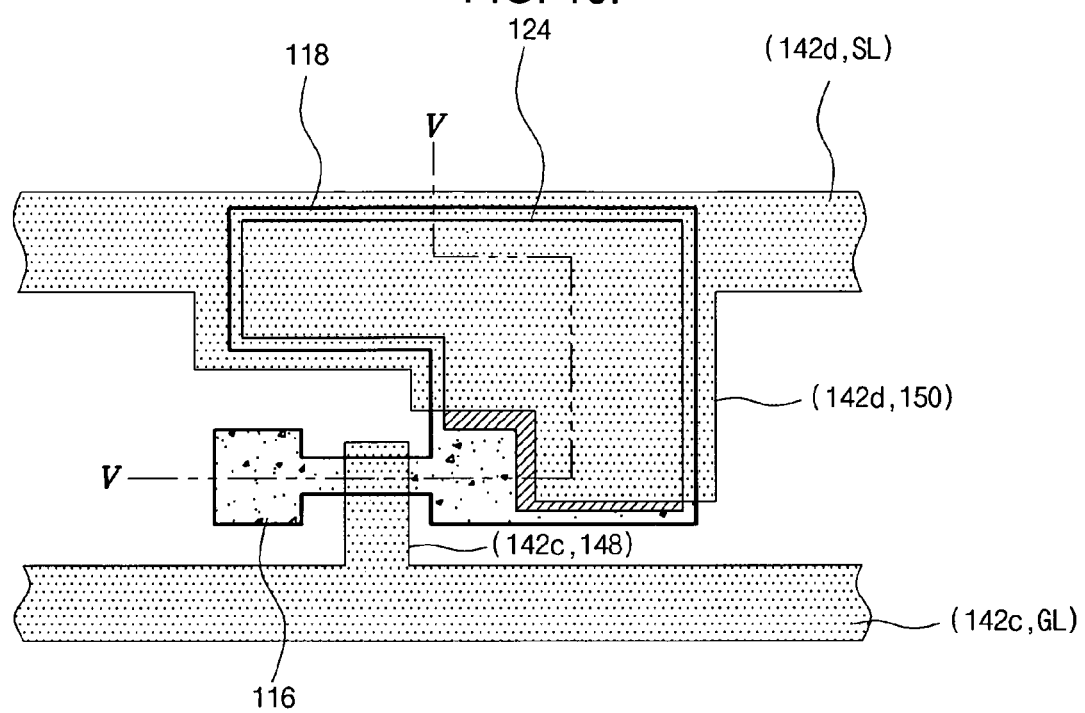
Figure 10J:
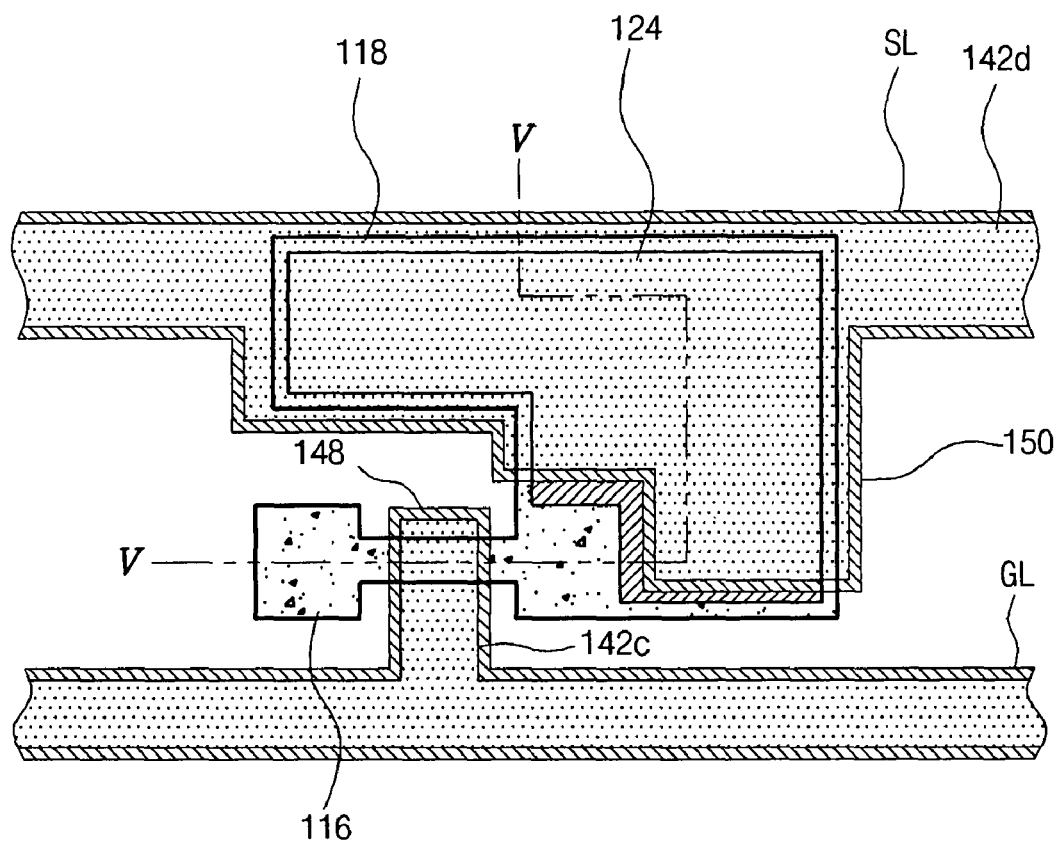
Figure 10K:
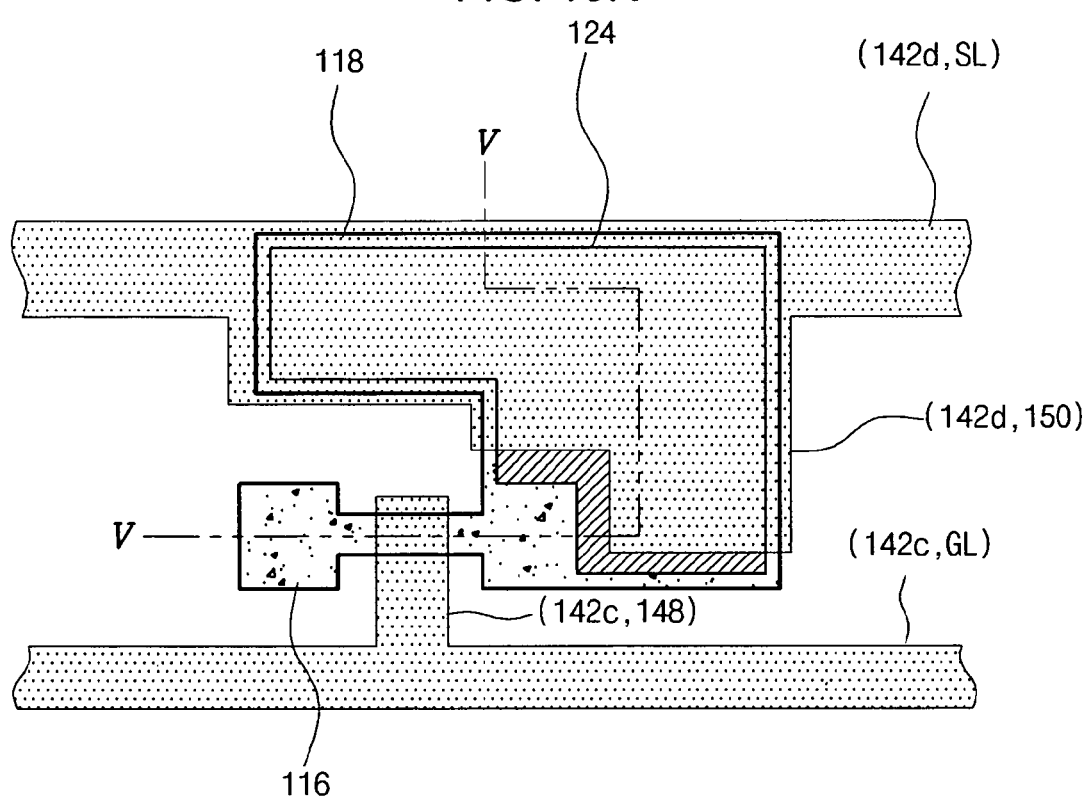
Figure 10L:
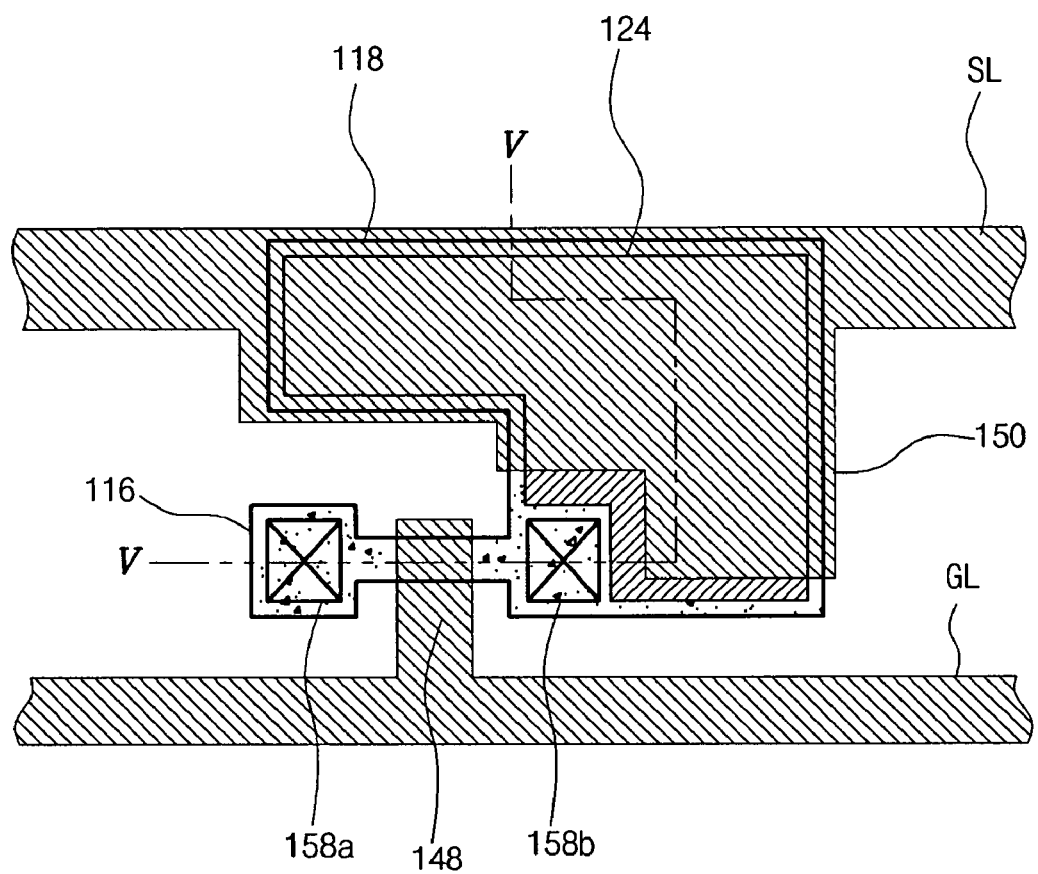
Figure 10M:
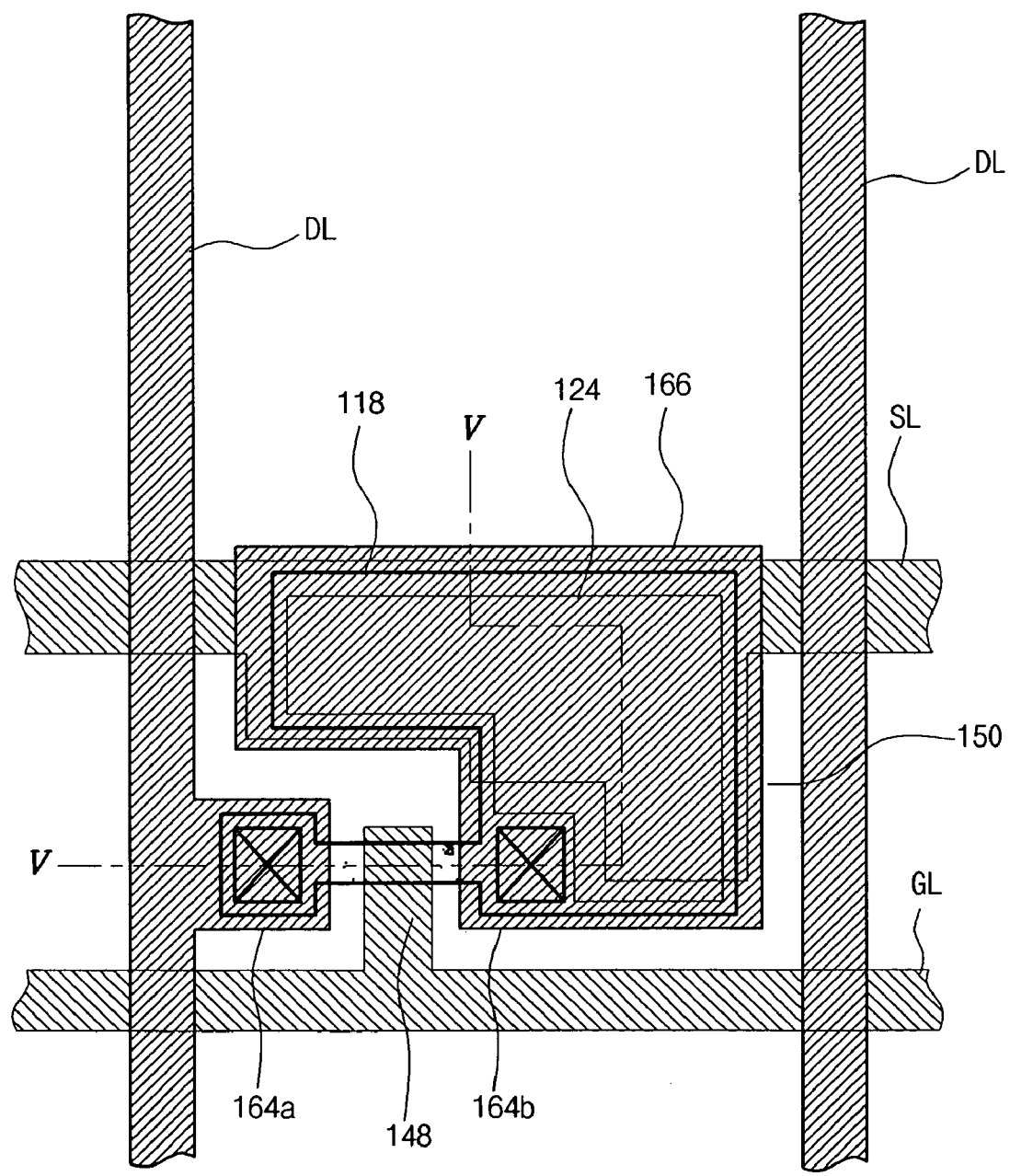
Figure 10N:
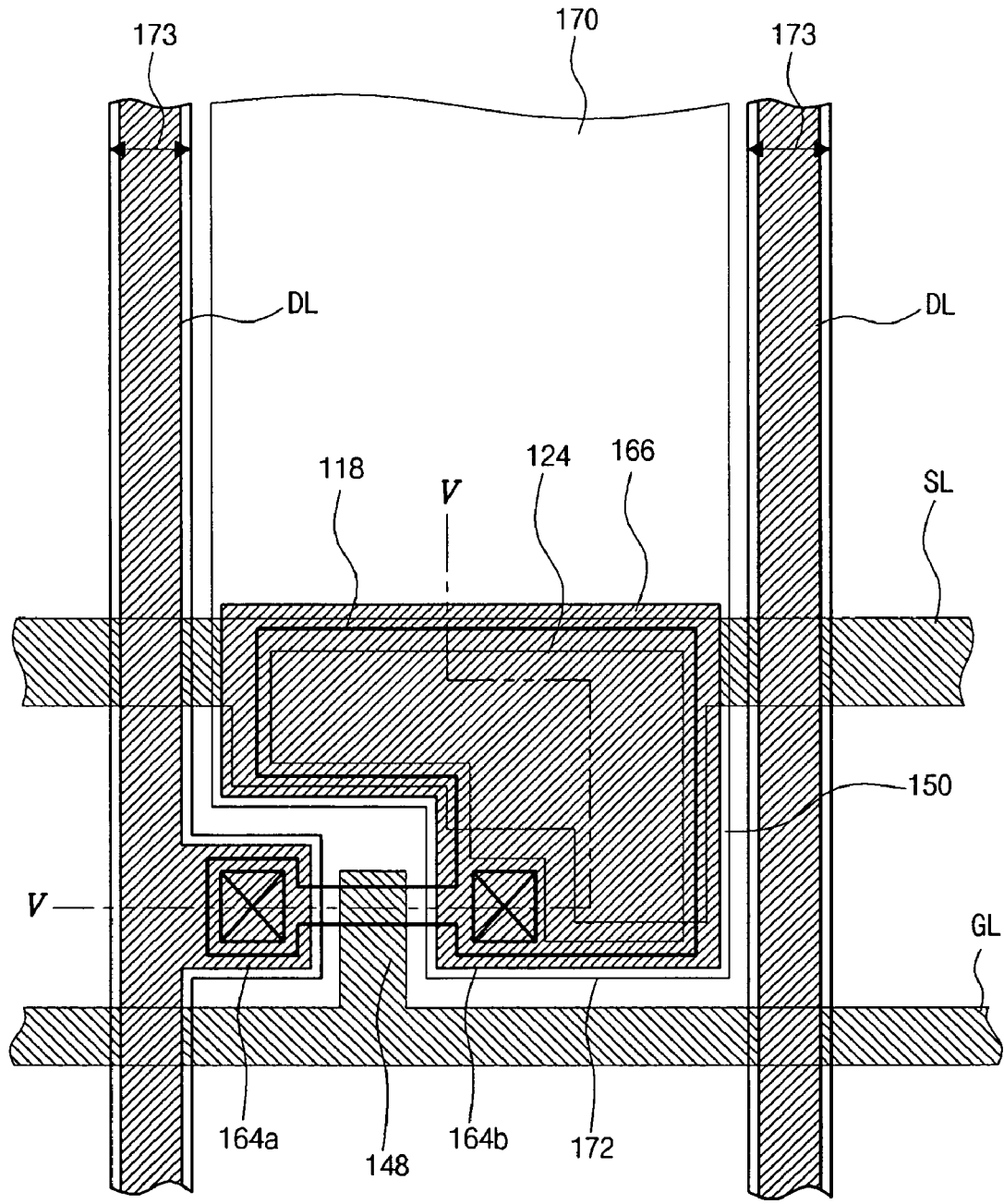
Figure 11A:
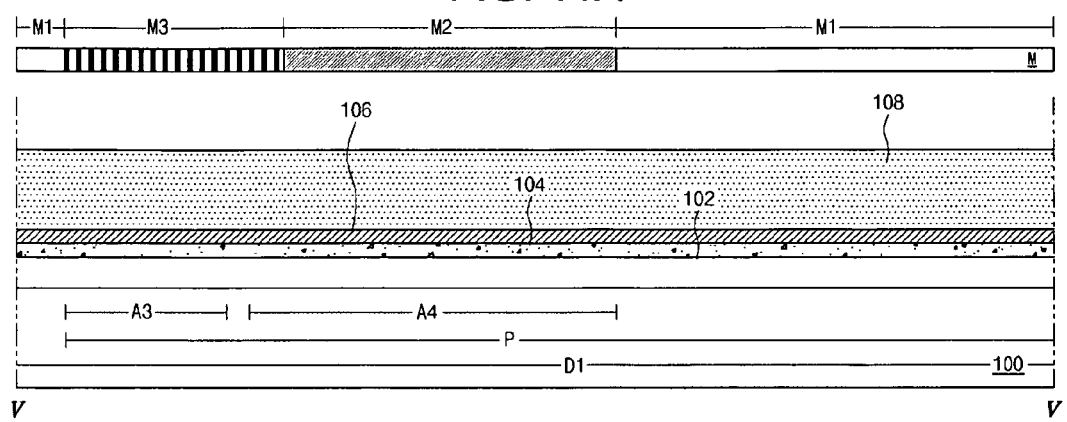
FIGS. 11A to 11N are cross-sectional views taken along lines V-V of FIGS. 10A to 10N, respectively.
Figure 11B:
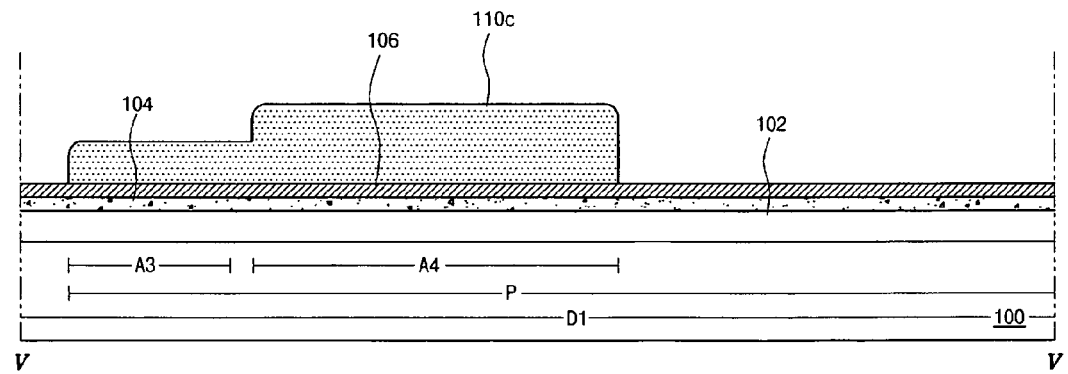
Figure 11C:
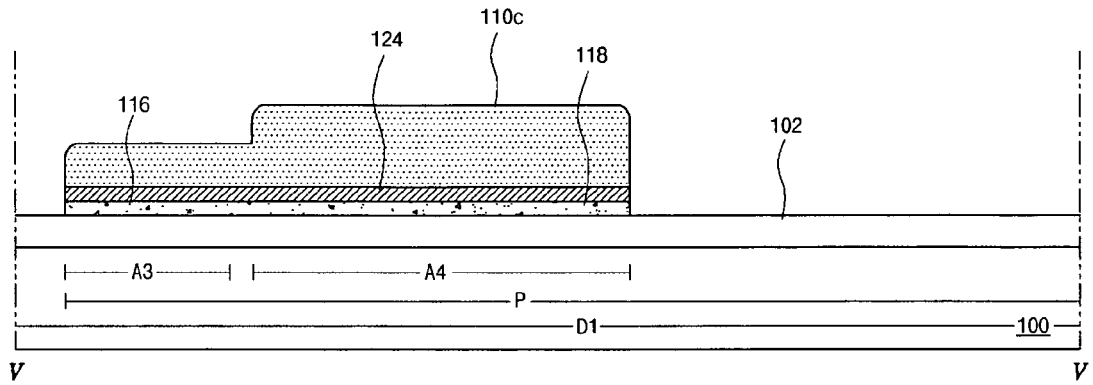
Figure 11D:
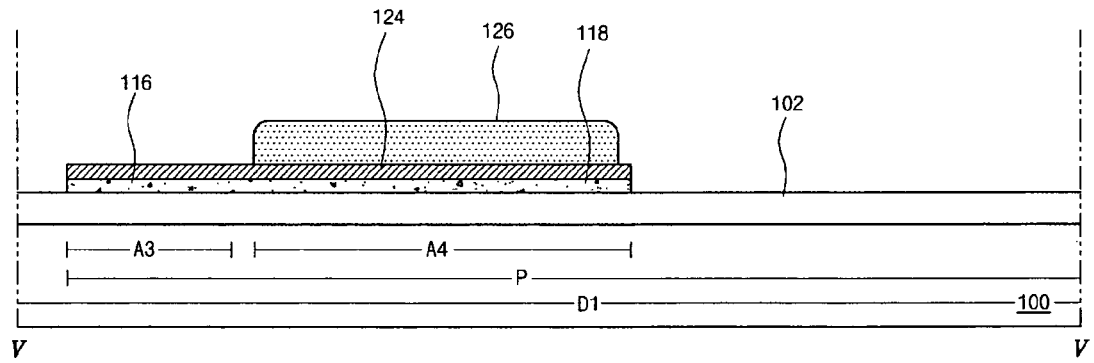
Figure 11E:
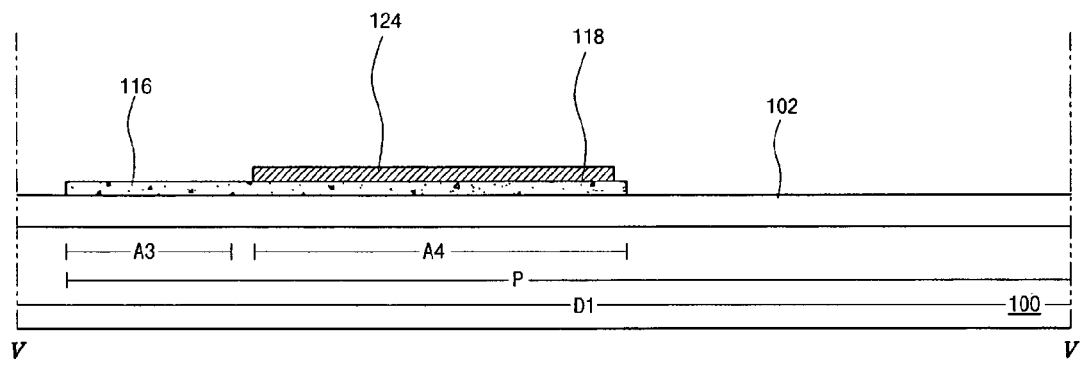
Figure 11F:
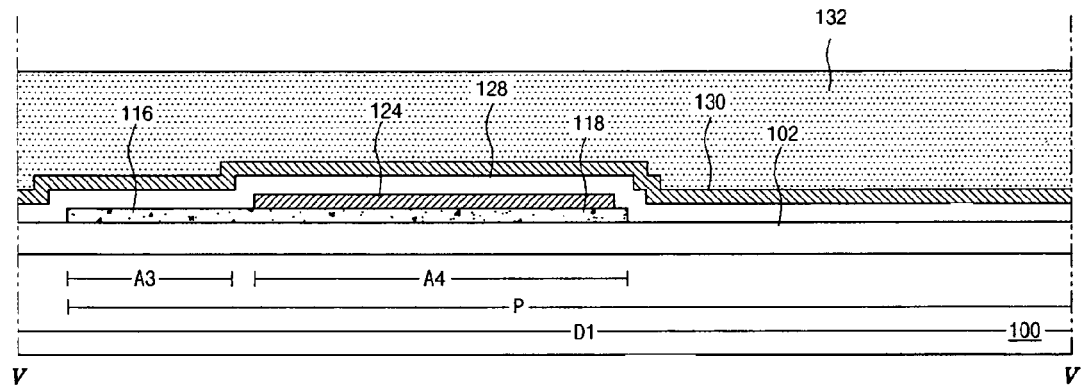
Figure 11G:
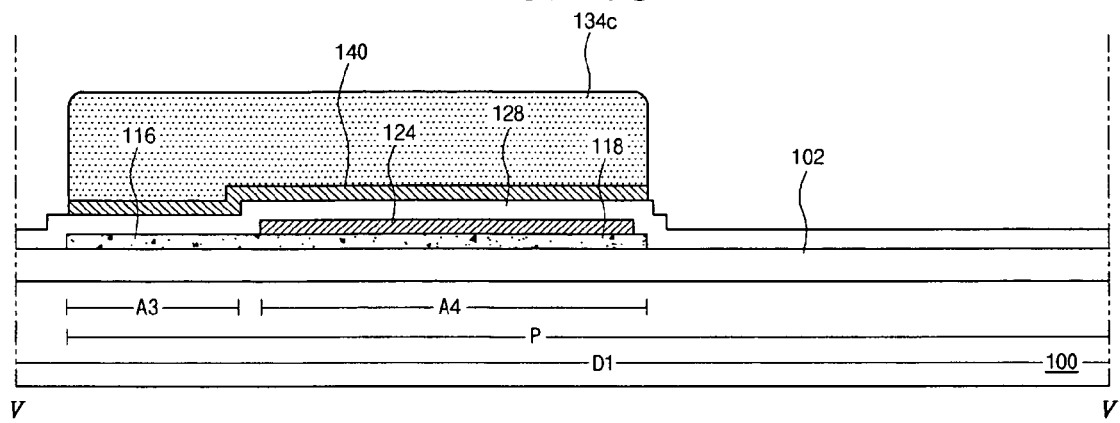
Figure 11H:
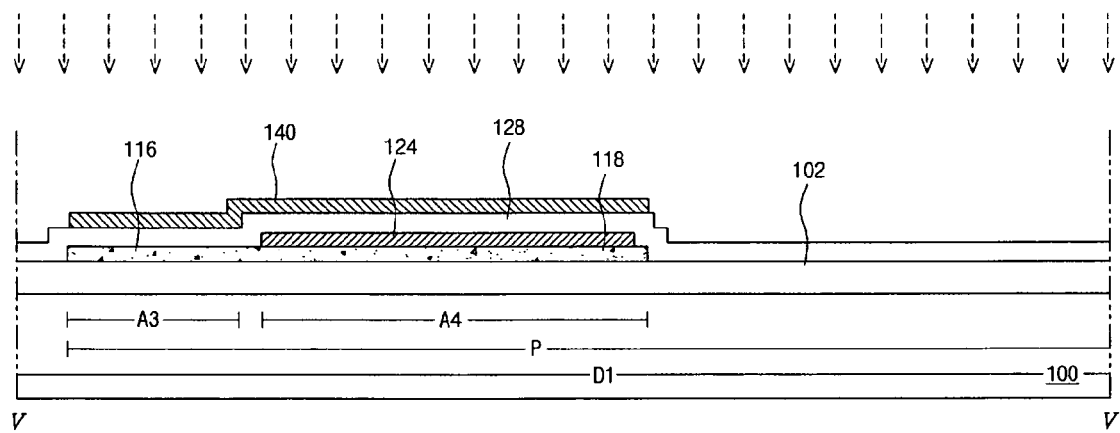
Figure 11I:
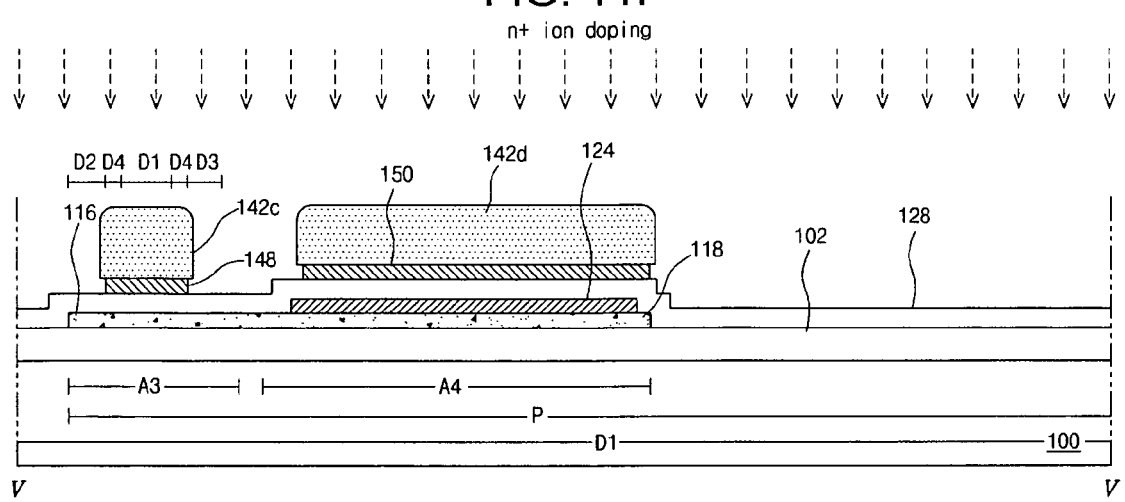
Figure 11J:
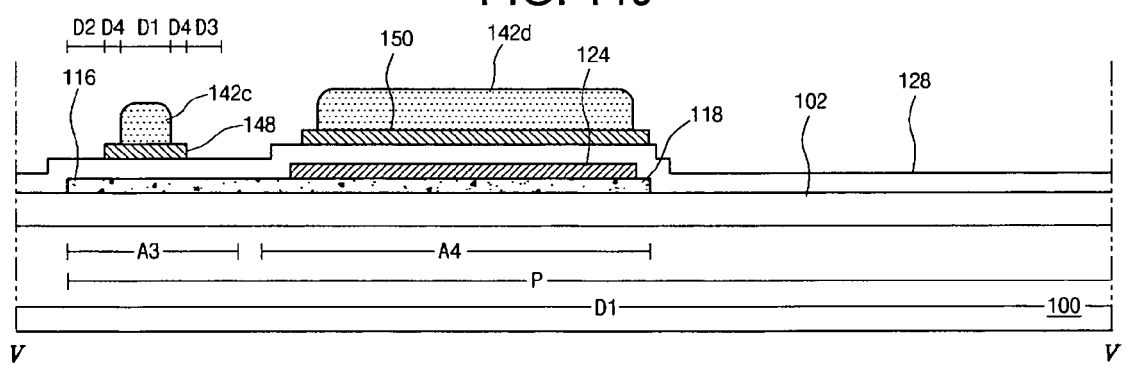
Figure 11K:
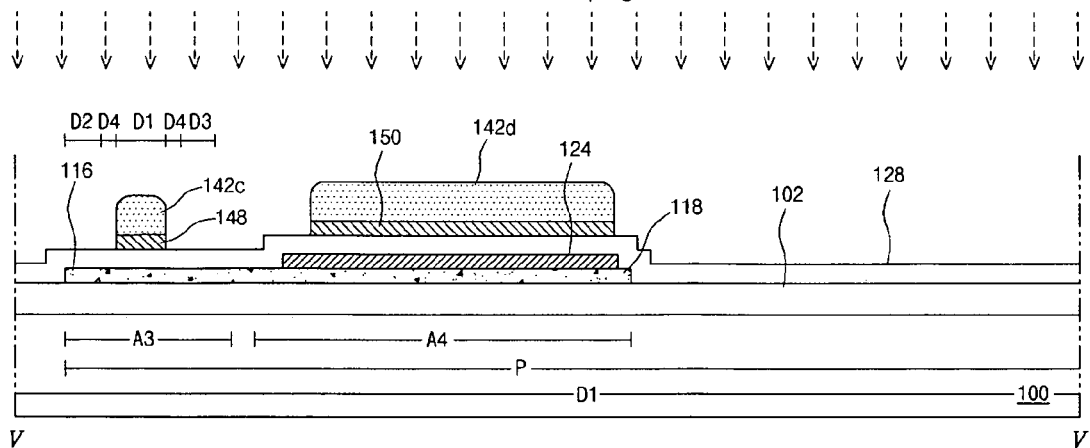
Figure 11L:
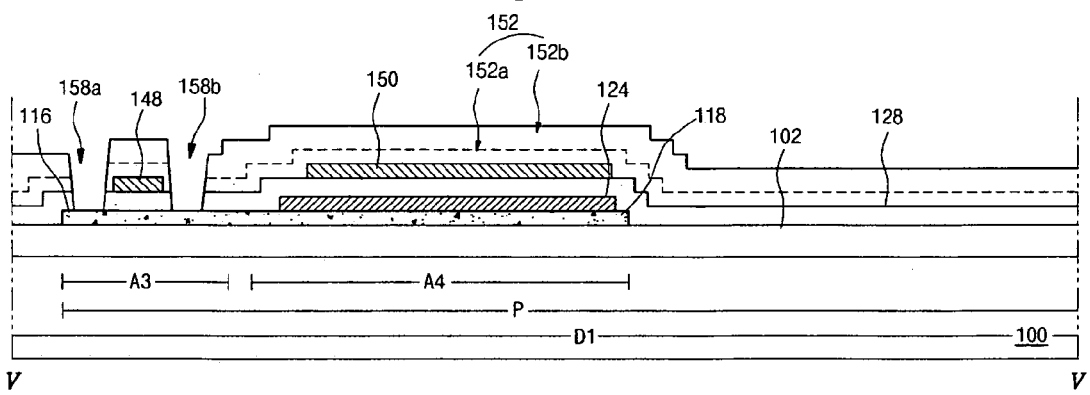
Figure 11M:
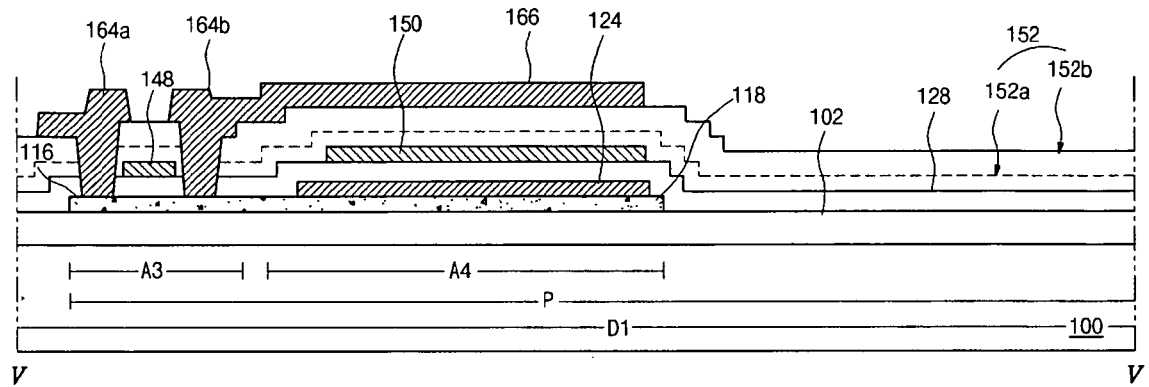
Figure 11N:
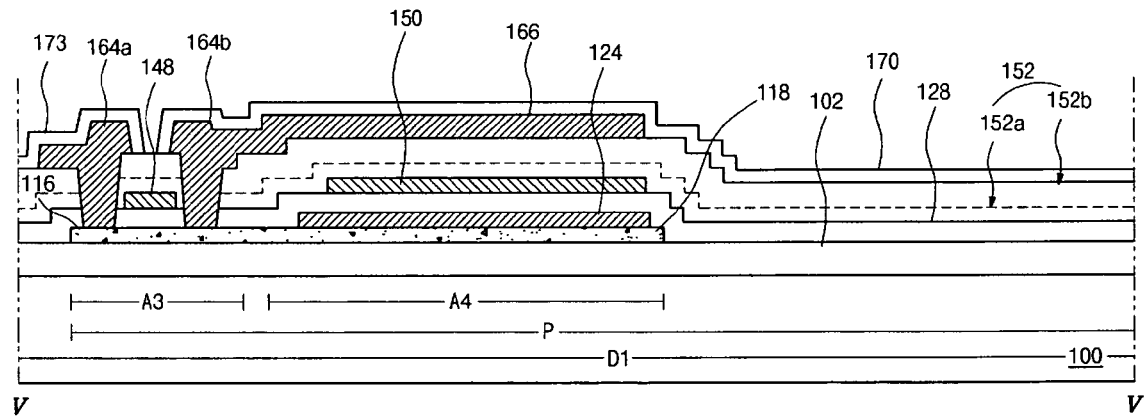

FIGS. 9A to 9N are cross-sectional views illustrating fabrication processes in a non-display region of an array substrate according to the exemplary embodiment of the present invention, FIGS. 10A to 10N are plan views illustrating fabrication processes in a display region of an array substrate according to the exemplary embodiment of the present invention, and FIGS. 11A to 11N are cross-sectional views taken along lines V-V of FIGS. 10A to 10N, respectively.

As shown in FIGS. 9A, 10A and 11A, a buffer layer 102, a polycrystalline silicon layer 104 and a first metal layer 106 are formed on a substrate 100 having a display region D1 and a non-display region D2. The non-display region D2 has a p-type region A1 and an n-type region A2, and the display region D1 has a pixel region P, a switching region A3 and a storage region A4.

The buffer layer 102 may be made of an inorganic insulating material including silicon nitride (SiNx) and silicon oxide ($SiO_2$). The polycrystalline silicon layer 104 may be formed by depositing, dehydrogenating and crystallizing hydrogenated amorphous silicon (a-Si:H). The first metal layer 106 may include tungsten (W), molybdenum (Mo), chromium (Cr) and molybdenum-tungsten (MoW).

A first photoresist layer 108 is formed on the first metal layer 106. A first mask M is disposed over the first photoresist layer 108. The first mask M includes a transmissive portion M1, a blocking portion M2 and a semi-transmissive portion M3. The semi-transmissive portion M3 passes light having an amount more than the blocking potion M2 and less than the transmissive portion M1. The semi-transmissive portion M3 may have a half-transmissive film or a slit structure.

The mask M is arranged such that the blocking portion M2 corresponds to the storage region A4, the semi-transmissive portion M3 corresponds to the p-type region A1, the n-type region A2 and the switching region A3, and the transmissive portion M1 corresponds to the other regions except for the above regions A1 to A4. The semi-transmissive portion M3 corresponding to the switching region A3 and the blocking region M1 corresponding to the storage region A4 adjoin each other.

The first photoresist layer 108 is exposed on light using the mask M. It is supposed that the first photoresist layer 108 is a p-type where a portion exposed on light is developed and a portion not exposed on light remains.

As shown in FIGS. 9B, 10B and 11B, the first photoresist layer (108 of FIGS. 9A, 10A and 11A) exposed on light with the first mask (M of FIGS. 9A and 11A) is developed to form first to third photoresist patterns 110a, 110b and 110c. Since the n-type and p-type regions A1 and A2 correspond to the semi-transmissive portion (M3 of FIG. 9A), the first and second photoresist patterns 110a and 110b has a level lower than the first photoresist layer. Since the semi-transmissive portion (M3 of FIG. 11A) corresponding to the switching region A3 and the blocking portion (M1 of FIG. 11A) corresponding to the storage region A4 adjoin each other, a portion of the third photoresist pattern 110c in the switching region A3 has a level lower than a portion of the third photoresist pattern 110c in the storage region A4. The third photoresist pattern 110c has a step between the switching region A3 and the storage region A4.

The first metal layer 106 and the polycrystalline silicon layer 104 are etched using the first to third photoresist patterns 110a, 110b and 110c as etching masks.

As shown in FIGS. 9C, 10C and 11C, by the etching process, a first metal pattern 120 and a first polycrystalline semiconductor pattern 112 are formed below the first photoresist pattern 110a, a second metal pattern 122 and a second polycrystalline semiconductor pattern 114 are formed below the second photoresist pattern 110b, and a third metal pattern 124 and third and fourth polycrystalline semiconductor patterns 116 and 118 in one body are formed below the third photoresist pattern 110c. An ashing process is performed for the first to third photoresist patterns 110a to 110c As shown in FIGS. 9D, 10D and 11D, by the ashing process, the first and second photoresist patterns (110a and 110b of FIG. 9C) are completely removed, the portion of the third photoresist pattern 110c corresponding to the switching region A3 is also completely removed, and the portion of the third photoresist pattern 110c corresponding to the storage region A4 is partially removed.

The first to third metal patterns 120, 122 and 124 are etched using the ashed third photoresist pattern 110c as an etching mask.

As shown in FIGS. 9E, 10E and 11E, by the etching process, the first and second metal patterns (120 and 122 of FIG. 9D) and the portion of the third metal pattern 124 corresponding to the switching region A3 are removed, and the portion of the third metal pattern 124 corresponding to the storage region A4 remains. The etched third metal pattern 124 is a storage pattern 124.

By the first mask process explained above, the first and second polycrystalline semiconductor patterns 112 and 114 are formed in the p-type and n-type regions A1 and A2, respectively. The third and fourth polycrystalline semiconductor patterns 116 and 118 in one body are formed in the switching region A3 and the storage region A4, respectively. The storage pattern 124 is formed on the fourth polycrystalline semiconductor pattern 118. Since the storage pattern 124 is formed on the fourth polycrystalline semiconductor pattern 118, a separate doping process to use the fourth polycrystalline semiconductor pattern 118 as a storage electrode like the related art is not needed. The storage pattern 124 and the fourth polycrystalline semiconductor pattern constitute a first storage electrode (S1 of FIG. 8B).

As shown in FIGS. 9F, 10F and 11F, a gate insulating layer 128 is formed on the substrate 100 having the first storage electrode. A second metal layer 130 is formed on the gate insulating layer 128. A second metal layer 130 may include chromium (Cr), molybdenum (Mo), tungsten(W), copper (Cu) and aluminum alloy (AlNd). A second photoresist layer 132 is formed on the second metal layer 130. A photolithography process including an exposure process and a developing process is performed for the second photoresist layer 132 using a second mask (not shown).

As shown in FIGS. 9G, 10G and 11G, by the photolithography process, first to third photoresist patterns 134a to 134c are formed. The first photoresist pattern 134a corresponds to a center portion of the first polycrystalline semiconductor pattern 112. The second photoresist pattern 134b covers the second polycrystalline semiconductor pattern 114. The third photoresist pattern 134c covers the third and fourth polycrystalline semiconductor patterns 116 and 118.

The second metal layer (130 of FIGS. 9F, 10F and 11F) is etched using the first to third photoresist patterns 134a to 134c as etching masks to form a first gate electrode 136 and first and second metal patterns 138 and 140.

Referring to FIG. 10G, the third photoresist pattern 134c is not only formed over the third and fourth polycrystalline semiconductor patterns 116 and 118 but also formed in a region where a gate line GL and a storage line SL are formed. Accordingly, the gate line GL and the storage line SL is formed at the same process of forming the first gate electrode 136 and the first and second metal patterns 138 and 140.

The first polycrystalline semiconductor pattern 112 has a first channel portion B1 corresponding to the first gate electrode 136, and first source and drain portions B2 and B3 at both sides of the first channel portion B1. The first channel portion B1 is covered by the first gate electrode 136, and the first source and drain portions B2 and B3 are not covered by the first gate electrode 136. The first metal pattern 138 covers the second polycrystalline semiconductor pattern 114, and the second metal pattern 140 covers the third and fourth polycrystalline semiconductor patterns 116 and 118. The first to third photoresist patterns 134a to 134c are then removed.

As shown in FIGS. 9H, 10H and 11H, an ion doping process using p+ ions is performed. The first gate electrode 136 and the first and second metal patterns 138 and 140 are used as doping masks. The first channel portion B1 is not doped, and the first source and drain portions B2 and B3 are doped. The first source and drain portions B2 and B3 doped have an ohmic contact property.

As shown in FIGS. 9I, 10I and 11I, a third photoresist layer is formed on the substrate 100 having the first gate electrode 136. A photolithography process is performed for the third photoresist layer using a third mask (not shown). By the photolithography process, first to fourth photoresist patterns 142a to 142d are formed. The first photoresist pattern 142a covers the first polycrystalline semiconductor pattern 112. The second photoresist pattern 142b corresponds to a center portion of the second polycrystalline semiconductor pattern 114. The third photoresist pattern 142c corresponds to a center portion of the third polycrystalline semiconductor pattern 116. The third photoresist pattern 142c is also formed on the gate line GL. The fourth photoresist pattern 142d is formed in the storage region A4. The fourth photoresist pattern 142d is also formed on the storage line SL.

The first and second metal patterns (138 and 140 of FIGS. 9H, 10H and 11H) is etched using the first to fourth photoresist patterns 142a to 142d as etching masks to form second and third gate electrodes 146 and 148 and a second storage electrode 150.

The second polycrystalline semiconductor pattern 114 has a second channel portion C1, second source and drain portions C2 and C3 at both sides of the second channel portion C1, and first lightly-doped drain (LDD) portions C4 between the second channel portion C1 and the second source and drain portions C2 and C3. The second channel portion C1 and the first LDD portions C4 are covered by the second gate electrode 146, and the second source and drain portions C2 and C3 are not covered by the second gate electrode 146.

The third polycrystalline semiconductor pattern 116 has a third channel portion D1, third source and drain portions D2 and D3 at both sides of the third channel portion D1, and second lightly-doped drain (LDD) portions D4 between the third channel portion D1 and the third source and drain portions D2 and D3. The third channel portion D1 and the second LDD portions D4 are covered by the third gate electrode 148, and the third source and drain portions D2 and D3 are not covered by the third gate electrode 148.

The second storage electrode 150 is spaced apart from the third gate electrode 148 and extended from the storage line SL. The second storage electrode 150 faces the first storage electrode.

An ion doping process using n+ ions is performed when the first to fourth photoresist patterns 142a to 142d remain. The second and third channel portions C1 and D1 and the first and second LDD portions C4 and D4 are not doped, and the second and third source portions C2 and D2 and the second and third drain portions C3 and D3 are doped. The second and third source portions C2 and D2 and the second and third drain portions C3 and D3 doped have an ohmic contact property.

Referring to FIG. 10, a part (lower part) of the fourth polycrystalline semiconductor pattern 118 is not covered by the storage pattern 124 and the second storage electrode 150. In particular, by the ashing and etching processes of FIGS. 11C to 11E, an outside portion of the storage pattern 124 is removed, and outside parts of the fourth polycrystalline semiconductor pattern 118 is not covered by the storage pattern 124. An outline of the storage pattern 124 is disposed in an outline of the fourth polycrystalline semiconductor pattern 118. Among the outside parts of the fourth polycrystalline semiconductor pattern 118, some part is also not covered by the second storage electrode 150. Therefore, the some part (lower part) is doped with n+ ions.

As shown in FIGS. 9J, 10J and 11J, an ashing process is performed for the first to fourth photoresist patterns 142a to 142d. By the ashing process, the first to fourth photoresist patterns 142a to 142d are partially removed. In more detail, the ashing process is performed until ends of the second and third photoresist patterns 142b and 142c accord with ends of the second and third channel portions C1 and D1, respectively. Side portions of the second and third gate electrodes 146 and 148 corresponding to the first and second LDD portions, respectively, are exposed. Side portions of the first and fourth photoresist patterns 142a and 142d are partially removed. The first photoresist pattern 142 still covers the first gate electrode 136. Side portions of the second storage electrode 150, the gate line GL and the storage line SL are exposed.

An etching process is performed so that the exposed side portions of the second and third gate electrodes 146 and 148, the second storage electrode 150, the gate line GL and the storage line SL are removed. The second and third gate electrodes 146 and 148 etched correspond to the second and third channel portions C1 and D1, respectively.

As shown in FIGS. 9K, 10K and 11K, an ion doping process using n− ions is performed when the ashed first to fourth photoresist patterns 142a to 142d remain. The first and second LDD portions C4 and D4 are doped with n− ions. A dosage amount of the n− ions less than those of the p+ ions and the n+ ions. The second source and drain portions C2 and C3 and the third source and drain portions D2 and D3 are not influenced by the n− ion doping. The second and third channel portions C1 and D1 are not doped by the n− ions. As the LDD portions C4 and D4 are formed, leakage current due to thermoelectric effect is minimized. The first to fourth photoresist patterns 142a to 142d are then removed.

By the second and third mask processes explained above, the first to third gate electrodes 136, 146 and 148 are formed, the first to third polycrystalline semiconductor patterns 112, 114 and 116 are doped with the p+, n+ and n− ions, and the second storage electrode 150 is formed.

As shown in FIGS. 9L, 10L and 11L, an interlayer insulating film 152 is formed on the substrate 100 having the first to third gate electrodes 136, 146 and 148. The interlayer insulating film 152 has a first layer 152a made of silicon oxide ($SiO_2$) and a second layer 152b made of silicon nitride (SiNx).

A fourth photoresist layer is formed on the interlayer insulating film 152. The interlayer insulating film 152 is patterned using a fourth mask to form first to sixth contact holes 154a, 154b, 156a, 156b, 158a and 158b. The first source and drain portions (B2 and B3 of FIG. 9H) are exposed through the first and second contact holes 154a and 154b, respectively. The second source and drain portions (C2 and C3 of FIG. 9J) are exposed through the third and fourth contact holes 156a and 156b, respectively. The third source and drain portions (D2 and D3 of FIG. 11J) are exposed through the fifth and sixth contact holes 158a and 158b, respectively After forming the contact holes 154a, 154b, 156a, 156b, 158a and 158b, a thermal treatment is performed. By the thermal treatment, the n+ ions doped at the some part (lower part) of the fourth polycrystalline semiconductor pattern 118, as explained above, is diffused toward below the storage electrode 124. An ohmic contact is made between the storage pattern 124 and the fourth polycrystalline semiconductor pattern 118, where the n+ ions is diffused, and thus the storage pattern 124 and the n+ ion-diffused fourth polycrystalline semiconductor portion 118 are connected electrically.

The sixth contact hole 158b may be formed on the fourth polycrystalline semiconductor pattern 118 outside the storage pattern 124 or on the storage pattern 124 because the third and fourth polycrystalline semiconductor patterns 116 and 118 are formed in one body and the fourth polycrystalline semiconductor pattern 118 has an ohmic contact property.

As shown in FIGS. 9M, 10M and 11M, a third metal layer is formed on the interlayer insulating film 152 and patterned using a fifth mask to form first source and drain electrodes 160a and 160b, second source and drain electrodes 162a and 162b, third source and drain electrodes 164a and 164b and a third storage electrode 166. The third storage electrode 166 is extended from the third drain electrode 164b, and the third storage electrode 166 and the third drain electrode 164b are formed in one body. A data line DL is formed at the same time of forming the source and drain electrodes 160a, 160b, 162a, 162b, 164a and 164b and the third storage electrode 166. A third metal layer may include chromium (Cr), molybdenum (Mo), tungsten (W), copper (Cu) and aluminum alloy (AlNd).

A shown in FIGS. 9N, 10N and 11N, a transparent conductive material layer is formed on the substrate 100 having the source and drain electrodes 160a, 160b, 162a, 162b, 164a and 164b and the third storage electrode 166. The transparent conductive material includes indium-tin-oxide (ITO), indium-zinc-oxide (IZO) and indium-tin-zinc-oxide (ITZO). The transparent conductive material layer is patterned using a sixth mask to form a pixel electrode 170 in the pixel region P.

The pixel electrode 170 completely covers and directly contacts the third drain electrode 164b and the third storage electrode 166. The pixel electrode 170 also directly contacts the interlayer insulating film 152. A shield pattern 172 and a shield line 173 are formed at the same time of forming the pixel electrode 170. The shield pattern 172 completely covers and directly contacts each of the first source and drain electrodes 160a and 160b and the second source and drain electrodes 162a and 162b. The shield line 173 completely covers and directly contacts the data line DL and the third source electrode 164a.

An etching solution for the transparent conductive material layer may cause a galvanic phenomenon by reacting with the metal patterns DL, 160a, 160b, 162a, 162b, 164a, 164b and 166 below the transparent conductive material layer. To prevent this problem, the pixel electrode 170, the shield pattern 172 and the shield line 173 completely cover the metal patterns DL, 160a, 160b, 162a, 162b, 164a, 164b and 166 therebelow. The pixel electrode 170 directly contacts the second layer 152b of the interlayer insulating film 152. Since the second layer 152b is made of silicon nitride (SiNx), an interface property of the interlayer insulating film 152 and the pixel electrode 170 is good and a resistance of the pixel electrode 170 does not increase.

Through the above-explained six mask processes, the array substrate for the LCD device according to the exemplary embodiment is fabricated. Although not shown in the drawings, a color filter substrate facing the array substrate is fabricated by forming a color filter layer corresponding to each pixel region, a black matrix corresponding to the gate and data lines, and a common electrode facing the pixel electrode. The array substrate and the color filter substrate are attached and a liquid crystal layer is filled between the array substrate and the color filter substrate, and thus the LCD device is fabricated.

The array substrate according to the exemplary embodiment is fabricated by mask processes less than those of the related art. Product cost can be reduced and productivity increases.

It will be apparent to those skilled in the art that various modifications and variations can be made in the liquid crystal display device and the method of fabricating the liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
 a p-type driving thin film transistor and an n-type driving thin film transistor in a non-display region of a substrate, the p-type driving thin film transistor including a first polycrystalline semiconductor pattern, a first gate electrode, a first source electrode and a first drain electrode, and the n-type driving thin film transistor including a second polycrystalline semiconductor pattern, a second gate electrode, a second source electrode and a second drain electrode, wherein each of the first source electrode, the first drain electrode, the second source electrode and the second drain electrode has a top surface and a side surface;

a gate line and a data line in a display region of the substrate and that cross each other to define a pixel region, wherein the data line has a top surface and a side surface;

a pixel thin film transistor connected to the gate line and the data line, the pixel thin film transistor including a third polycrystalline semiconductor pattern, a third gate electrode, a third source electrode and a third drain electrode, wherein the third source electrode has a top surface and a side surface;

a pixel electrode that covers and directly contacts the third drain electrode;

a shield pattern that covers and directly contacts the top surfaces of each of the first source electrode, the first drain electrode, the second source electrode and the second drain electrode, and covers and directly contacts the side surfaces of each of the first source electrode, the first drain electrode, the second source electrode and the second drain electrode; and a shield line that covers and directly contacts the top surfaces of each of the data line and the third source electrode, and covers and directly contacts the side surfaces of each of the data line and the third source electrode, wherein the pixel electrode, the shield pattern and the shield line are made of a transparent conductive material.

2. The device according to claim 1, further comprising a storage capacitor in the pixel region, wherein the storage capacitor includes a first storage electrode, a second storage electrode on the first storage electrode, and a third storage electrode on the second storage electrode and extended from the third drain electrode.

3. The device according to claim 2, wherein the first storage electrode includes a fourth polycrystalline semiconductor pattern extended from the third polycrystalline semiconductor pattern, and a storage pattern directly on the fourth polycrystalline semiconductor pattern.

4. The device according to claim 3, wherein an outline of the storage pattern is disposed in an outline of the fourth polycrystalline semiconductor pattern.

5. The device according to claim 3, wherein the fourth polycrystalline semiconductor pattern has ions.

6. The device according to claim 3, wherein a part of the fourth polycrystalline semiconductor pattern is disposed outside of the second storage electrode.

7. The device according to claim 3, further comprising a gate insulating layer on the first to third polycrystalline semiconductor patterns and the first storage electrode, and an interlayer insulating film on the first to third gate electrodes and the second storage electrode, wherein the pixel electrode is disposed directly on the interlayer insulating film.

8. The device according to claim 7, wherein the interlayer insulating film includes a first layer made of silicon nitride (SiNx) that contacts the pixel electrode.

9. The device according to claim 8, wherein the interlayer insulating film further includes a second layer made of silicon oxide ($SiO_2$) below the first layer.

* * * * *